United States Patent
Falik et al.

(10) Patent No.: US 7,562,283 B2
(45) Date of Patent: Jul. 14, 2009

(54) SYSTEMS AND METHODS FOR ERROR CORRECTION USING BINARY CODED HEXIDECIMAL OR HAMMING DECODING

(75) Inventors: Ohad Falik, Kfar Saba (IL); Yuval Itkin, Zoran (IL)

(73) Assignee: D.S.P. Group Ltd., Pituach (IL)

( * ) Notice: Subject to any disclaimer, the term of this patent is extended or adjusted under 35 U.S.C. 154(b) by 555 days.

(21) Appl. No.: 11/325,677

(22) Filed: Jan. 5, 2006

(65) Prior Publication Data

US 2007/0157064 A1   Jul. 5, 2007

Related U.S. Application Data

(63) Continuation-in-part of application No. 11/316,889, filed on Dec. 27, 2005, now abandoned.

(51) Int. Cl.
*H03M 13/00* (2006.01)
(52) U.S. Cl. .................................. 714/785; 714/777
(58) Field of Classification Search .................. 714/777, 714/782, 785
See application file for complete search history.

(56) References Cited

U.S. PATENT DOCUMENTS

| | | | |
|---|---|---|---|
| 4,509,172 A | 4/1985 | Chen | |
| 4,716,566 A | 12/1987 | Masuhara et al. | |
| 4,716,567 A | 12/1987 | Ito et al. | |
| 4,866,716 A | 9/1989 | Weng | |
| 4,890,286 A | 12/1989 | Hirose | |
| 5,357,527 A | 10/1994 | Coates et al. | |
| 5,459,740 A | 10/1995 | Glaise | |
| 5,574,717 A | 11/1996 | Tomizawa et al. | |
| 5,754,567 A | 5/1998 | Norman | |
| 5,768,296 A | 6/1998 | Langer et al. | |
| 6,089,749 A | 7/2000 | Blaum et al. | |
| 6,119,262 A | 9/2000 | Chang et al. | |
| 6,493,845 B1 | 12/2002 | Shen et al. | |
| 6,539,513 B1 | 3/2003 | Chen | |
| 6,601,211 B1 | 7/2003 | Norman | |
| 6,651,213 B2 | 11/2003 | Hassner et al. | |
| 6,971,056 B1* | 11/2005 | Classon et al. | ............... 714/782 |
| 7,099,190 B2* | 8/2006 | Noguchi et al. | ......... 365/185.09 |
| 7,278,085 B1* | 10/2007 | Weng et al. | .................. 714/766 |
| 2002/0178421 A1 | 11/2002 | Hassner et al. | |

(Continued)

FOREIGN PATENT DOCUMENTS

EP     0 107 038 B1    5/1984

(Continued)

OTHER PUBLICATIONS

Wicker, S. P., "Error Control Systems for Digital Communication and Storage", Parrentic Hall, (1995), IBN 0-13-200809-2, pp. 90-92.

*Primary Examiner*—Esaw T Abraham
(74) *Attorney, Agent, or Firm*—Browdy and Neimark, P.L.L.C.

(57) ABSTRACT

Systems and methods for error correction of data. In one embodiment of the invention, a plurality of error correction schemes are applied when encoding data and depending on the circumstances, one or more of those schemes is selected to decode the data. In one of these embodiments, the applied error correction schemes include the BCH algorithm and the Hamming algorithm.

4 Claims, 17 Drawing Sheets

U.S. PATENT DOCUMENTS

| | | |
|---|---|---|
| 2003/0126513 A1 | 7/2003 | Wuidart |
| 2003/0131308 A1 | 7/2003 | Lee et al. |
| 2004/0088645 A1 | 5/2004 | Ashkhmin et al. |
| 2004/0268209 A1 | 12/2004 | Srivastava et al. |
| 2005/0071731 A1 | 3/2005 | Atri et al. |

FOREIGN PATENT DOCUMENTS

| | | |
|---|---|---|
| EP | 0 209 902 A2 | 1/1987 |
| EP | 0 318 547 B1 | 11/1988 |
| EP | 0 684 712 A2 | 11/1995 |
| EP | 0 917 059 A1 | 5/1999 |
| EP | 1 309 145 A2 | 5/2003 |
| JP | 7099454 | 4/1995 |
| JP | 8286981 | 11/1996 |
| JP | 10276099 | 10/1998 |
| WO | WO 88/09011 A1 | 11/1988 |
| WO | WO 2004/040506 A1 | 5/2004 |
| WO | WO2005/076133 | 8/2005 |

* cited by examiner

SYSTEMS AND METHODS FOR ERROR CORRECTION USING BINARY CODED HEXIDECIMAL OR HAMMING DECODING

FIELD OF THE INVENTION

The invention relates to error correction.

BACKGROUND OF THE INVENTION

When storing or transferring data, error correction schemes may be used to add extra information (AKA redundant data) to allow detection and/or correction of errors in the data when the data is later retrieved or received.

The detection and correction of errors may be required because data retrieved from memory devices, such as for example flash devices (including inter-alia NAND AND or NOR flash with or without multiple bits per cell), DRAM memories, 1 T on-chip memories, SRAM memories (including inter-alia in a low voltage silicon process), magnetic medias, and/or data transferred over a communication channel may have errors due to various reasons. Reasons for errors include inter-alia, radiation, random errors caused by noise and other reasons, errors caused by defective bits, and/or any other reason that may cause data loss at the time of the write, at the time of the read, at the time of the transfer and/or over time if the data is stored in memory. Factors which in some cases may cause variations in memory data retention (i.e. variations in data loss over time) include inter-alia process variations and the device life cycle (endurance).

SUMMARY OF THE INVENTION

According to the present invention, there is provided a method for error correcting a block of data, comprising: providing a block of data which has been encoded using at least two error correction schemes; and applying selectively at least one of the error correction schemes according to a predetermined criterion to decode the block of data.

According to the present invention, there is also provided, a method for correcting errors, comprising: computing a binary coded hexadecimal (BCH) decoding syndrome to determine if a number of errors is zero for a block of data which includes at least a previously computed BCH encoding syndrome and a previously computed Hamming encoding-syndrome; in the case that the determined number of errors is not zero, using the BCH computed decoding syndrome or a function thereof in order to detect whether there is a single error or multiple errors; in the case that the detected number of errors equals to one, using a Hamming decoding syndrome or a function thereof to locate the detected error; in the case that the detected number of errors is more than one, using the computed BCH decoding syndrome or a function thereof to locate the more than one error; and correcting the located at least one error.

According to the present invention, there is further provided a system for correcting errors, comprising: means for providing a block of data which has been encoded using at least two error correction schemes; and means for decoding the block of data by selectively applying at least one of the error correction schemes.

DESCRIPTION OF THE DRAWING FIGURES

These and other objects, features and advantages of the present invention will be apparent from a consideration of the following Detailed Description of the Invention when considered with the drawing Figures, in which.

DETAILED DESCRIPTION OF THE INVENTION

Figure 1A:
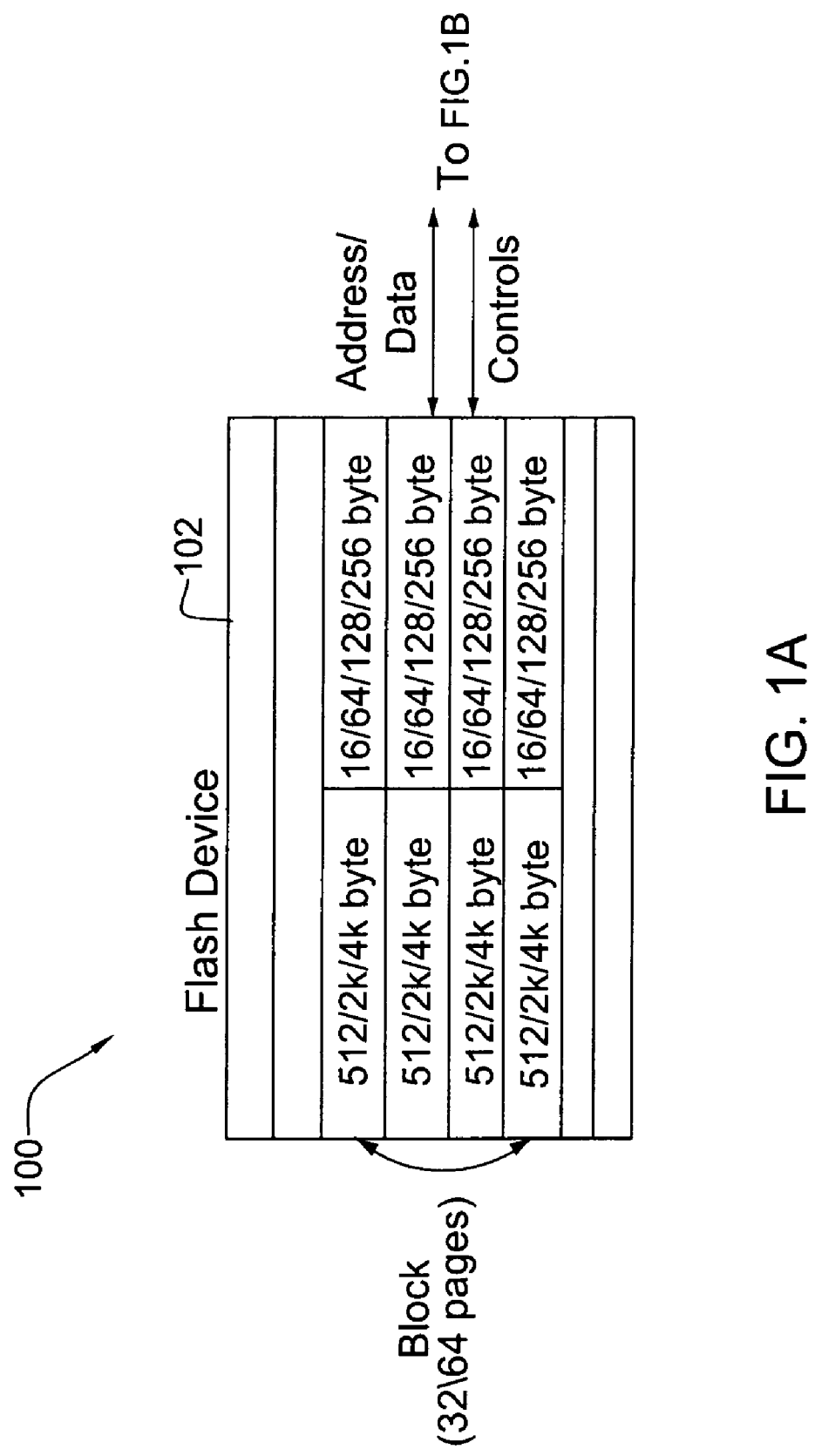
FIG. 1 is a block diagram of a system including error correction of data read from memory, according to an embodiment of the present invention.

Described herein are embodiments of the current invention for error correction.

As used herein, the phrase "for example," "such as" and variants thereof describing exemplary implementations of the present invention are exemplary in nature and not limiting.

The error correction processes described below with respect to (error correction) encoding (i.e. generating redundant data which can later be used to detect and possibly correct errors) and (error correction) decoding (i.e. using the previously generated redundant data to check the data for errors), can be used in any appropriate application. The error correction decoding process (also known as verification) can include one or more of the following inter-alia: detecting the number of errors, locating the errors and/or correcting the errors.

Depending on the circumstances, different schemes may be more appropriate than others for error correction in a particular application. The factors governing which scheme is more appropriate include one or more of the following inter-alia: the maximal number of errors that may exist and be detected, whether detection of the number of errors is desirable, whether detection of error location is desirable (e.g., for the purpose of error correction), the maximal number of errors whose location may be detected, size of the data block, size of the stored redundancy code, complexity of the calculations for error identification and error location identification. Therefore, a feature of the system of the invention is that the system supports more than one error correcting scheme and that one or more appropriate schemes are selectively used during decoding depending on the circumstances. In one embodiment of the invention, the selection of the error correcting scheme used to locate the errors depends at least partly on the number of errors which have been detected.

As the reader is aware, there are many schemes for error correction. Examples of error correcting codes which can be used include inter-alia: Forward Error Correction (FEC) based on block codes such as Hamming, BCH, Reed-Muller codes, Reed Solomon, Binary Golay, Group Codes, Parity bits, repletion scheme, or FEC based on convolution codes or Erasure codes.

By way of example, the invention is described with reference to two error correcting schemes. The first is only capable of locating errors in a given block of data when the number of errors is within a predetermined number range, and the second is capable of detecting whether the number of errors in a given block of data is within the predetermined number range that the first scheme can locate (i.e. capable of determining whether the first scheme can be properly applied). The first scheme is less computationally complex and/or less time consuming than the second scheme in locating errors when the number of errors is within the predetermined number range. For ease of description, described below is one error correcting scheme which is capable of locating errors when the number of errors in a virtual page is within a predetermined number of errors, i.e. the Hamming error correcting scheme which is capable of locating up to one error in a virtual page and which is an example of a linear code. For ease of description, described below is one error correcting scheme which is capable of detecting whether the number of errors is within the predetermined number range of errors, i.e. the BCH error correcting scheme. The specific flavor of BCH error correcting scheme described below is also capable of locating up to four errors in a virtual page, however the invention does not require that the same scheme used to detect the number of errors also be capable of locating errors nor in the invention limited by the number of errors which can be located. In an embodiment where the same scheme is used to detect whether the number of errors is within the predetermined number range and to locate the errors (if outside the predetermined number range), it is advantageous that the time and/or computational complexity involved in the scheme detecting the number of errors is less than the time and/or computational complexity involved in locating the errors. In another embodiment, one or more other error correcting scheme which is/are more computationally complex than the first error correcting scheme (that is used to locate errors where the number of errors is within a predetermined number range) is used to locate errors if the number of errors detected by the second error correcting scheme is outside the predetermined number range. In other embodiments, the supported schemes may differ. Similarly, it is possible to combine two or more schemes to tailor for other computational complexity and error distribution patterns.

Figure 1B:
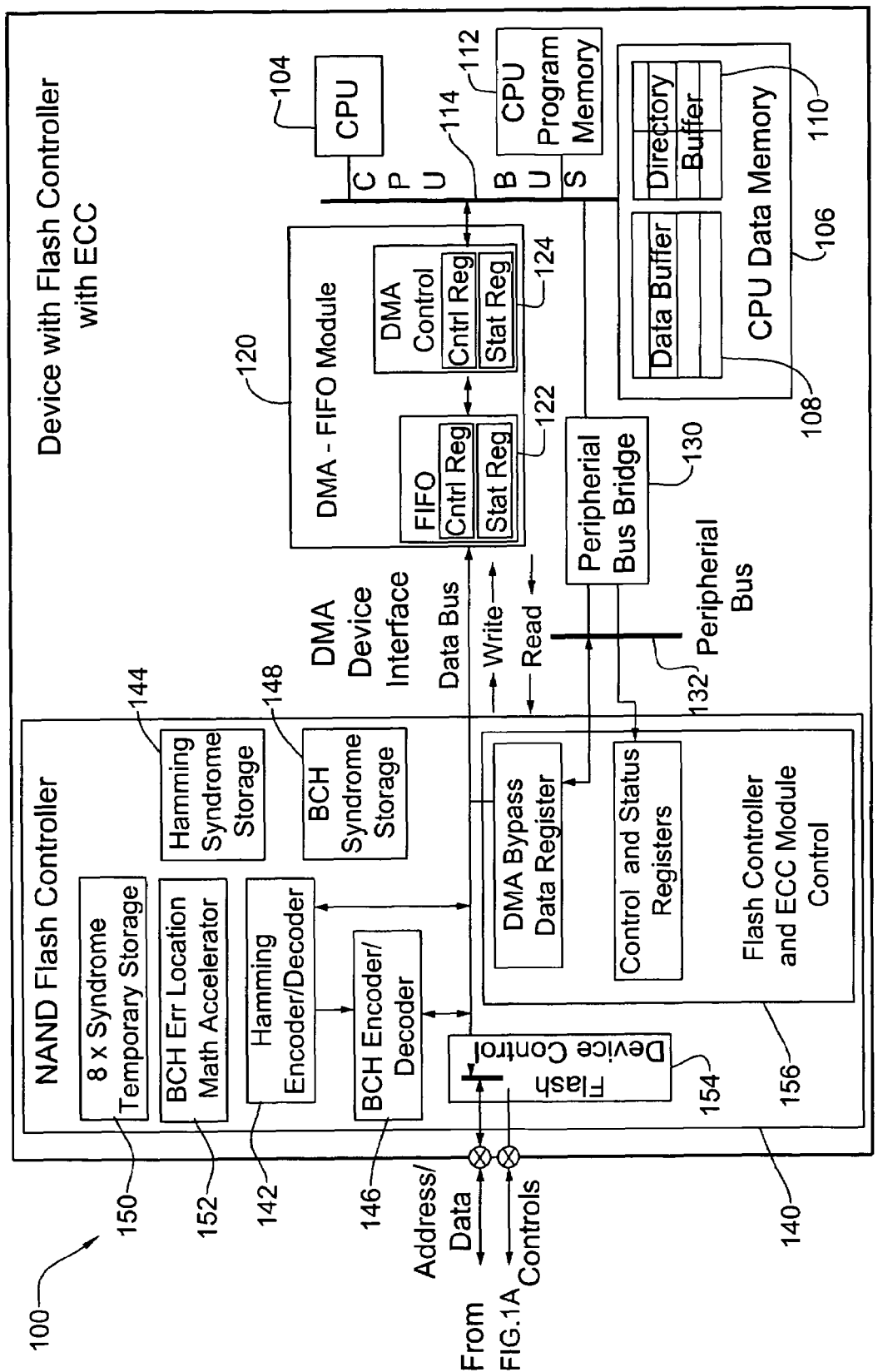

With reference now to FIG. 1, there is shown a system 100 including error correction, according to an embodiment of the present invention. Each of the modules of system 100 can be made up of any combination of software, hardware and/or firmware that performs the functions as defined and explained herein. System 100 can be any suitable system, either a real time system or a non-real time system. Because the invention in many cases reduces the time and/or complexity of error detection and/or correction, the invention is especially advantageous when computational complexity and/or time required to detect and/or correct errors is of importance for system 100.

For ease of explanation, it is assumed in the description below that encoding takes place prior to writing the data to a memory and decoding takes place when retrieving the data from that memory. Specifically, by way of example, the description assumes that encoding takes place when reading data from a first memory which is a CPU memory and writing the data to a second memory which is a flash device, and decoding takes place when reading data from the second memory and writing the data to the first memory. In another embodiment, encoding takes place prior to transferring data over a communication channel and decoding takes place on the other end of the communication channel.

For example, in one application a user may playback data from a memory. The data can be for example media, such as speech, audio and/or video in any suitable format, including inter-alia MP3, WMA, WAV, MIDI, AVI, WMV, JPG, MPEG. The time saved during the decoding error correction by the described invention may in some cases enhance the quality of the viewing or listening experience for the user and/or reduce the power used by the device.

In the illustrated embodiment, system 100 includes a flash device 102 (assumed for the sake of example to be a NAND flash), a CPU 104, a CPU data memory 106 (including a CPU data buffer 108 and a CPU directory buffer 110), and a CPU program memory 112. CPU 104, CPU data memory 106, and CPU program memory 112, are connected via a CPU bus 114 to DMA FIFO module 120. DMA FIFO module 120 includes FIFO registers 122 and DMA control 124. In operation, when writing to flash device 102, DMA module 120 reads data from CPU data memory 106, and passes the data to a flash controller 140 which writes the data to flash device 102 along with redundant data as will be explained in more detail further below. For the sake of example flash controller 140 is assumed to be a NAND flash controller. Alternatively (to DMA 120 transferring the data) data can be passed from CPU data memory 106 to flash controller 140, via a peripheral bus bridge 130 and a peripheral bus 132 by means of CPU read and write operations. Using the data read from CPU data memory 106, a Hamming encoder/decoder 142 and a BCH encoder/decoder 146 generate the respective Hamming and BCH encoding syndromes. A Hamming syndrome storage 144 and a BCH syndrome storage 148 store interim Hamming syndrome results and BCH syndrome results respectively, while the data is collected during encoding syndrome generation. In some cases, for example where there are multiple virtual pages in a physical page which are not continuous, the interim values of Hamming and BCH syndromes are temporarily stored in a temporary storage 150 (for example an 8× temporary storage 150) while the syndromes for other virtual pages in the physical page are being calculated. The generated Hamming and BCH encoding syndromes are stored in flash device 102 as redundant data along with the corresponding data read from CPU data memory 106. During decoding, flash controller 140 reads the data from flash device 102, enabling Hamming encoder/decoder 142 and BCH encoder/decoder to verify the read data as will be explained in more detail below. Hamming syndrome storage 144 and BCH syndrome storage 148 store interim Hamming syndrome results and BCH syndrome results respectively, while the data is collected during decoding syndrome generation. In some cases, for example where there are multiple virtual pages in a physical page which are not continuous, the interim values of Hamming and BCH syndromes are temporarily stored in a temporary storage 150 (for example an 8×temporary storage 150) while the syndromes for other virtual pages in the physical page are being calculated. Temporary storage 150 may also be used to temporarily store state data for example in some cases when the physical page of flash 102 includes more than one virtual page as will be explained in more detail below. Flash controller 140 also includes a BCH error location math accelerator 152, a flash device control 154, and ECC module control 156. Flash device control 154 controls flash device 102 and ECC module control 156 includes the registers used by flash controller 140 for operations including error correction. BCH error location math accelerator 152 is used during decoding to speed up some of the more computation intensive operations. Once the data is verified, the data is passed to CPU data memory 106 via either peripheral bus bridge 130 and peripheral bus 132 or via DMA module 120.

For ease of understanding more details on flash device 102, which as mentioned above is assumed for the sake of example to be a NAND flash device, are now provided. In the described embodiment flash 102 comprises one or more physical pages. For example, in FIG. 1 flash device 102 is shown comprising several NAND-blocks, each NAND-block having 32 or 64 physical pages, each with 511+16, 2048+64, or 4096+128 bits within. The size of each physical page can vary depending on the flash physical properties. For example, in one embodiment, the size of a physical page is tailored to include an amount of data that can be programmed at one time. For the purpose of error correction the physical page is partitioned into one or more virtual pages. Each virtual page includes data on which error correction can be applied as a block using one or more error correction schemes, the redundant data of the error correction schemes (i.e. syndrome(s)), and possibly may also include data on which error correction schemes are not applied. In some cases, the data on which error correction schemes are not applied is included in order to allow later update of the virtual page without altering the error correction codes. In one embodiment each virtual page has two parts named 'main block' and 'spare area', however there is no special required configuration. Optionally, the virtual pages are organized within a physical page in a non continuous mode, such that the main blocks of all virtual pages are organized one after the other, followed by the spare area of each virtual page. This arrangement fits better with some flash management schemes. In another embodiment, the virtual pages in a physical page are organized in a continuous manner (i.e. virtual pages are not interleaved), with each main block of a virtual page followed by the spare area of that virtual page.

Although FIG. 1 shows one flash device 102 controlled by nand flash controller 140, in other embodiments multiple flash devices 102 may be controlled by the same nand flash controller 140. For example in one of these other embodiments, flash controller 140 controls up to four different flash devices 102. When multiple flash devices 102 are controlled by a single flash controller 140, a chip select signal is used to select the flash device to be accessed. The access to two or more flash devices 102 may be interleaved using ready signals which may be used in parallel to operate on one flash device 102 and sense the status of the other flash devices 102.

The division of system 100 into the modules shown in FIG. 1 is for ease of understanding and in other embodiments any of the modules may be separated into a plurality of modules or alternatively combined with any other module(s). In other embodiments of the invention, system 100 may include less functionality or more functionality than the functionality provided by the modules illustrated in FIG. 1.

Figure 2:
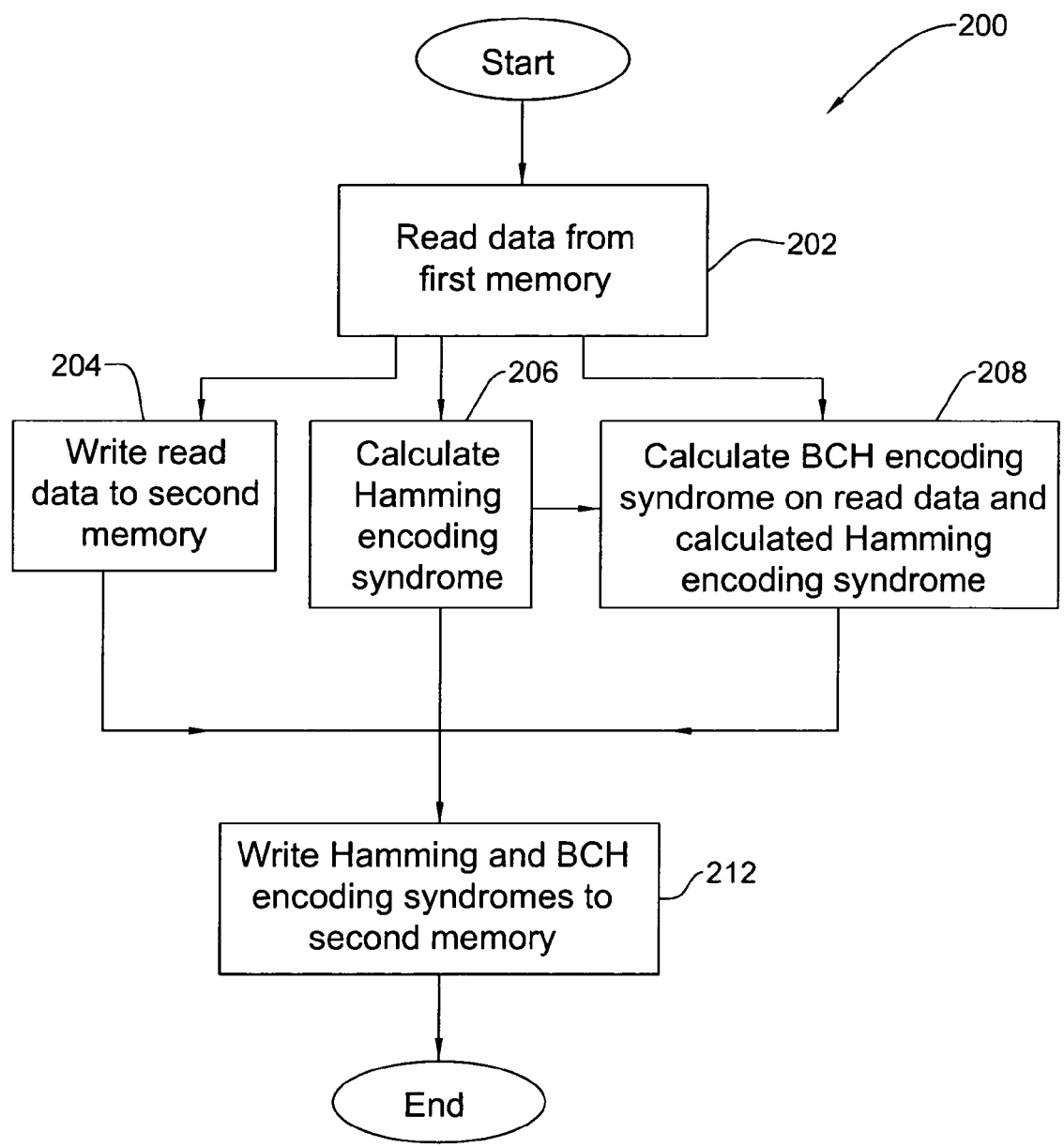
FIG. 2 is a flowchart of a method for writing data to memory, including error correction encoding, according to an embodiment of the present invention.

FIG. 2 is a flowchart of a method 200 for writing data to memory, including error correction encoding, according to an embodiment of the present invention. In the described embodiment, system 100 executes method 200. It is assumed that data is initially stored in a first memory, CPU data memory 106. In stage 202, the data is read from CPU data memory 106. As the data passes through flash controller 140, in order to be written in stage 204 to a second memory, flash device 102, the Hamming encoding syndrome (stage 206) and the BCH encoding syndrome (stage 208) are generated as part of the error correction encoding process. The generation of the syndromes while the data is on route eliminates the requirement for buffering the data, an advantage of this embodiment of the invention. In the described embodiment the BCH encoding syndrome is generated based also on the generated Hamming encoding syndrome and therefore FIG. 2 shows the results of stage 206 being fed into stage 208. The calculation of the Hamming and BCH encoding syndromes is carried out over virtual pages as explained above. In cases where the physical page includes more than one virtual page, temporary storage of interim Hamming and BCH encoding syndromes may be required, if the main blocks of all virtual pages are written before the spare areas of all virtual pages as explained above. In stage 212, the Hamming and BCH encoding syndromes are written to flash device 102. It is a feature of the invention that in many cases more than one error correction encoding syndrome is generated.

Figure 3:
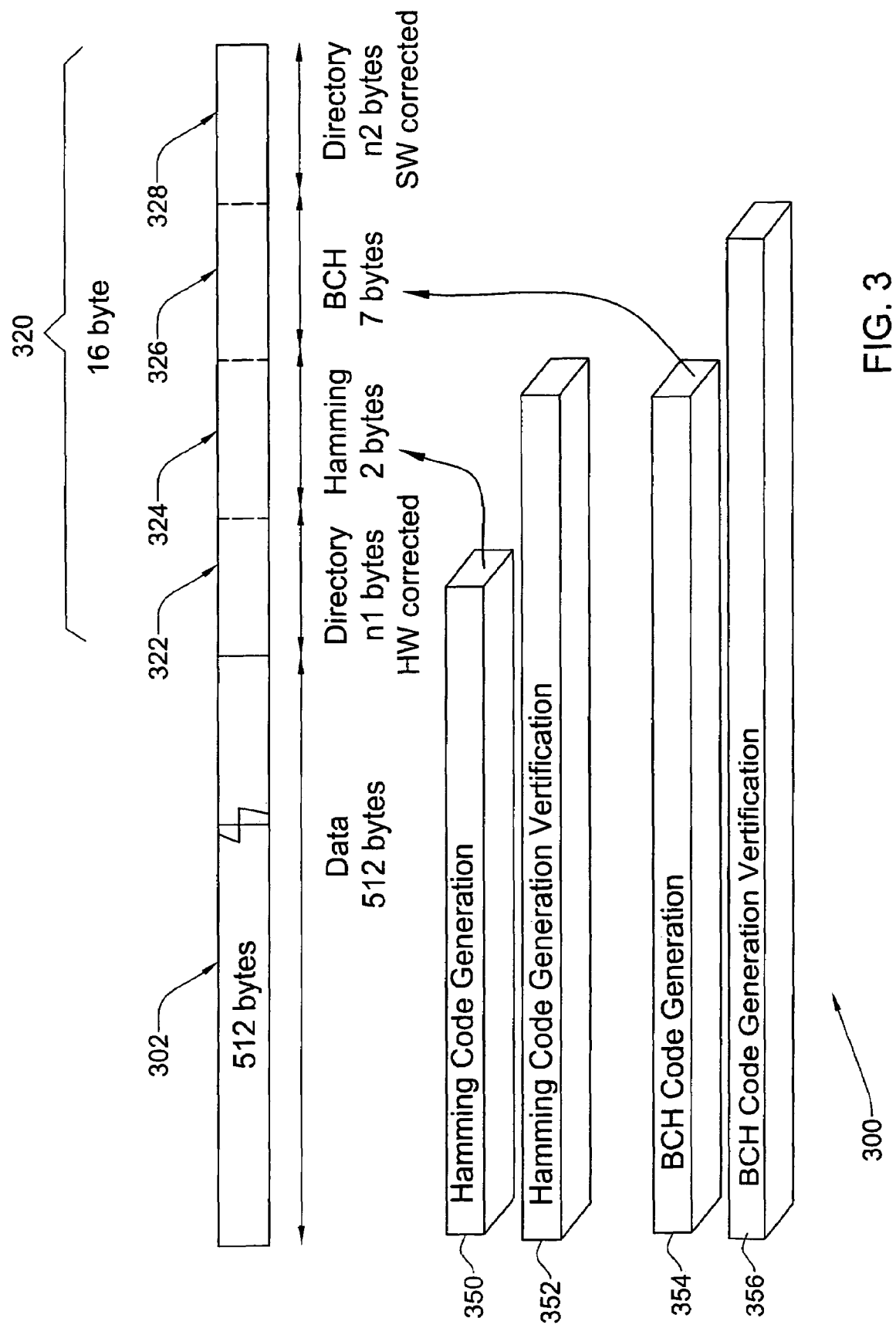
FIG. 3 is a visual representation of a virtual page in memory, according to an embodiment of the present invention.

FIG. 3 shows a visual representation of a virtual page organization within flash device 102, according to an embodiment of the present invention. The first data section (main block) 302 is 512 bytes read from CPU data buffer 108. The second section 320 (also known as spare area) includes 16 (or 32) bytes. Spare area 320 may be used for storing inter-alia information such as flash pages and blocks usage information (also known as directory data) and redundancy codes used by the error correcting code ECC algorithms. Spare area data 320 is read from directory buffer 110 (The Hamming and BCH encoding syndromes are initially blank when read in stage 202 and are filled in with the generation of the Hamming and BCH encoding syndromes in stages 206 and 208). In the illustrated embodiment, spare area 320 includes n1 bytes of directory data 322, two bytes of the Hamming encoding syndrome 324 generated by Hamming encoder/decoder 142, seven bytes of BCH encoding syndrome 326 generated by BCH encoder/decoder 146, and n2 directory bytes 328. The reader will understand that in the format presented, the generation 350 of Hamming encoding syndrome 324 is on data section 302 and n1 bytes 322, whereas the generation 354 of BCH encoding syndrome 326 is on data section 302, n1 bytes 322, and Hamming encoding syndrome 324. Since n2 bytes 328 are not corrected by the Hamming and BCH error correction schemes, n2 bytes 328 may be changed without impacting the Hamming and BCH correction. In one embodiment, n2 bytes 328 are corrected using other means.

As the reader is aware Hamming codes are a class of linear binary codes whose performance parameters are typically expressed as a function of a single integer m≧2. An (n,k) Hamming code is defined by a length equal to n=$2^m$−1 where the number of information symbols equals k=$2^m$−m−1, the number of syndrome symbols equals n−k=m, and the error correcting capability equals t=1. In order to generate an (n,k) Hamming code (including n information symbols followed by m syndrome symbols), a generation matrix comprising an identity matrix and a parity generation matrix is multiplied by the n information symbols. The parity generation matrix includes columns comprising all nonzero binary m-tuples.

In the described embodiment, the information symbols include 512 bytes of data 302 plus the n1 bytes of data 322 (which can range from 0 to 6 bytes). Therefore, the number of information symbols k can range from 4096 bits (if n1=0 bytes) to 4144 bits (if n1=6 bytes), and the required number of syndrome bits is 13 bits. The remaining 3 bits of the Hamming 2-byte encoding syndrome 324 is padded with zeros.

In the described embodiment, the code being used is:

| Index | Matrix |
|---|---|
| 0, | 1000100000000 |
| 1, | 1100100000000 |
| ... | ... |
| 4087, | 1111111111111 |
| 4088, | 0111111111111 |
| 4095, | 0000111111111 (last code for n1 = 0) |
| 4096, | 0111011111111 |
| 4103, | 0000011111111 (last code fore n1 = 1) |
| ... | ... |
| last code + 1, | 0000000000001 |
| last code + 2, | 0000000000010 |
| ... | ... |
| last code + 13, | 1000000000000 |

Such a code may be easily implemented using the scheme illustrated hereafter.

Figure 4:
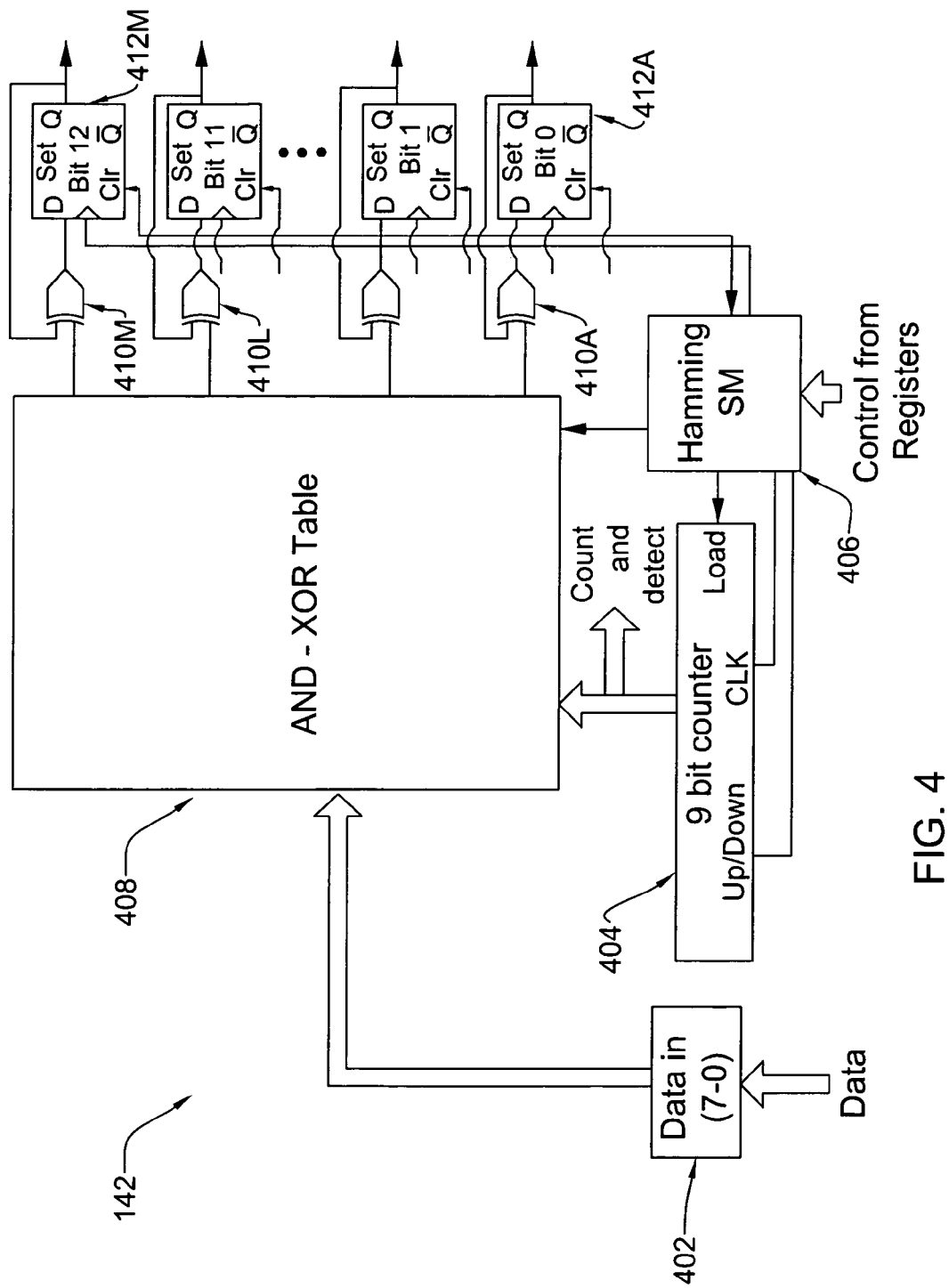
FIG. 4 is a hardware representation of a Hamming encoder/decoder, according to an embodiment of the present invention.

FIG. 4 illustrates a hardware representation 400 of Hamming encoder/decoder 142. Data 302 and n1 322 are inputted one byte at a time (as data in 402) during encoding, and data 302, n1 322 and Hamming encoding syndrome 324 are inputted one byte at a time (as data in 402) during decoding. A 9 bit counter comprising bits 3 to 11 counts as defined in FIG. 5 (see below) during Hamming encoding and counts as defined in FIG. 11 (see below) during Hamming decoding. The Hamming code/decode operation is controlled by the Hamming state machine 406, where state machine 406 follows the sequence of operations shown in FIG. 5 during encoding and the sequence of operations shown in FIG. 11 during decoding. Thirteen XOR gates 410A through 410M perform the XOR function on the output of an AND-XOR table 408 (defined below—see Table 1), and the outputs of XOR gates 410 are fed into memory elements 412A through 412M. Flip flops 412A through 412M accumulate the temporal value of the Hamming encoding or decoding syndrome from one data byte input to the other (corresponding to Hamming storage 144), and the final 13 bit Hamming encoding or decoding syndrome is available at the end of the encoding or decoding process defined respectively in FIGS. 5 and 11.

Table 1 below shows AND-XOR table 408, according to an embodiment of the present invention.

TABLE 1

Hamming Code AND-XOR table 408

| Hamming Bit | Up | Down | Unity 1 | Unity 2 |
|---|---|---|---|---|
|  | D7 ... D0 | D7 ... D0 | D7 ... D0 | D7 ... D0 |
| 0 | Counter bit 11 | Counter bit 11 | 0000 0001 | 0000 0000 |
| 1 | Counter bit 10 | Counter bit 10 | 0000 0010 | 0000 0000 |
| 2 | Counter bit 9 | Counter bit 9 | 0000 0100 | 0000 0000 |
| 3 | Counter bit 8 | Counter bit 8 | 0000 1000 | 0000 0000 |
| 4 | Counter bit 7 | Counter bit 7 | 0001 0000 | 0000 0000 |
| 5 | Counter bit 6 | Counter bit 6 | 0010 0000 | 0000 0000 |
| 6 | Counter bit 5 | Counter bit 5 | 0100 0000 | 0000 0000 |
| 7 | Counter bit 4 | Counter bit 4 | 1000 0000 | 0000 0000 |
| 8 | Counter bit 3 | Counter bit 3 | 0000 0000 | 0000 0001 |
| 9 | 1111 0000 | 0000 1111 | 0000 0000 | 0000 0010 |
| 10 | 1100 1100 | 0011 0011 | 0000 0000 | 0000 0100 |
| 11 | 1010 1010 | 0101 0101 | 0000 0000 | 0000 1000 |
| 12 | '1' | '0' | 0000 0000 | 0001 0000 |

For example, when counter 404 counts up, Hamming bit 0 is generated by separately ANDing each of the inputted bits in the byte of data-in 402 with the $11^{th}$ bit of counter 404 (see column 2, row 3 italicized in table 1) and then XOR'ing together the results of each AND operation. This is outputted as AND-XOR tree bit 0 to gate 410A. Similarly, Hamming bit 11, when counter 404 counts up is generated by ANDing data-in bit D7 402 with 1, data-in bit D6 402 with 0, data-in bit D5 402 with 1, data-in bit D4 402 with 0, data-in bit D3 402 with 1, data-in bit D2 402 with 0, data-in bit D1 402 with 1, and data-in bit D0 402 with 0, as shown bolded in column 2, row 14 of table 1, and then XOR'ing together the results of each AND (using XOR gate 410L).

Figure 5:
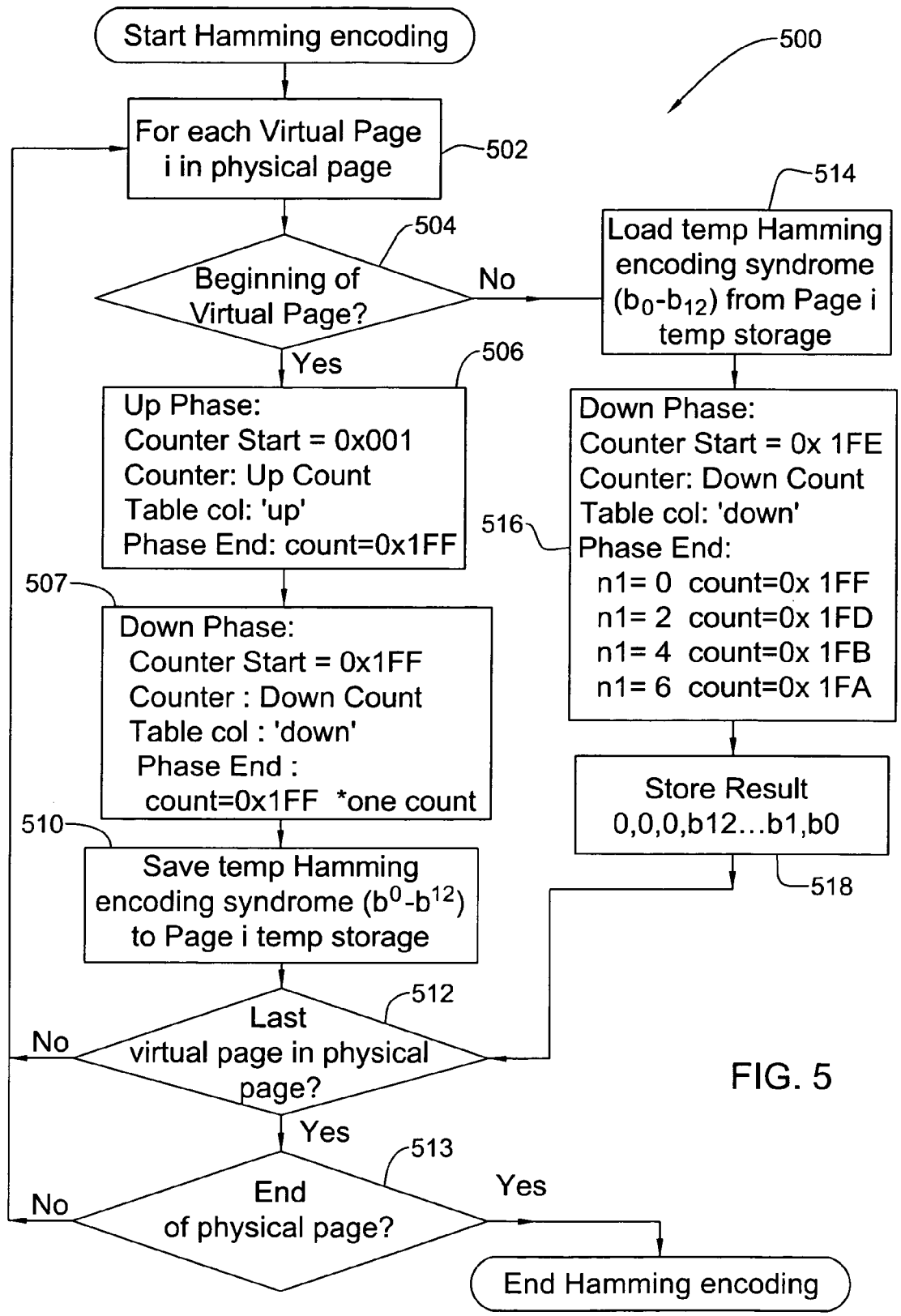
FIG. 5 is a flowchart of the generation of the Hamming encoding syndrome code using the circuit of FIG. 3, according to an embodiment of the present invention.

FIG. 5 is a flowchart of a method 500 for the generation of the Hamming encoding syndrome using Hamming encoder/decoder 142, according to an embodiment of the present invention and corresponding to stage 206. The illustrated embodiment 500 allows for interleaved operation on more than one virtual page (within a physical page). In stage 504, it is determined if the beginning of the virtual page i is being operated on. If yes, then in stage 506 counter 404 counts up in accordance with column 2 of table 1. The count ends at 0x1FF inclusive. Stage 506 is followed with stage 507 count down, which is executed for a single data input and a counter value of 0x1FF. In stage 510 the Hamming code result (for main block data 302) is temporarily stored in storage 150 in the location reserved for virtual page i (corresponding to stage 210 of method 200). Once main block data 302 for all the virtual pages in the physical page have been encoded but not spare data 320 (no in stage 513), the encoding of n1 322 proceeds for each virtual page i by repeating method 500 for all virtual pages again. In stage 514, the temporarily stored Hamming code result for main block 302 of the corresponding virtual page i is retrieved. In stage 516, counter 404 counts down in accordance with column 3 of table 1, starting in value 0x1FE. The end of the count depends on the number of bytes of n1 322 in virtual page i. (For example, note that if n1=0, this step includes zero operations). In stage 518 the resulting Hamming encoding syndrome for virtual page i is written to the second memory along with the padded zeros (corresponding to stage 212 of method 200). The reader will understand that method 500 can be adapted to an embodiment where the physical page included only one virtual page or if the virtual pages are continuous in memory (i.e., virtual pages are not interleaved) by omitting stages 502, 504, 510 and 512, 513 and 514 and proceeding with stages 516 through 518 directly after stage 507.

As the reader is aware, a BCH (Bose-Chaudhuri-Hochquenghem) code can be applied by treating a binary message sequence as a list of coefficients of a polynomial; where the coefficients are binary digits 0 and 1 under modulo 2 arithmetic and the polynomials form finite fields under modulo polynomial arithmetic. Encoding or decoding is done by multiplying message polynomials by a generator function.

In one embodiment of the invention, the BCH algorithm used allows for error correction of up to four errors in the protected data of a virtual page (where the protected data is data 302, directory 322 and Hamming encoding syndrome 324 during BCH encoding process, and the protected data is data 302, directory 322, Hamming encoding syndrome 324 and BCH encoding syndrome 326 during BCH decoding process). The usage of four polynomial functions over a $2^{13}$ Galois field and 52 bits of redundant data (i.e. BCH 326) can protect up to $(2^{13}-1)$ bits and detect up to four errors in the protected bits. Listed below are the four polynomial equations used in this embodiment of the invention in computing the generator function which can be multiplied by protected data (message) polynomials during the encoding or decoding. (Note that for ease of understanding when the coefficient is zero, the power does not appear in the equation).

$$\phi_1(x) = 1 + x + x^2 + x^3 + x^4 + x^{13} \quad (1)$$
$$\phi_2(x) = 1 + x^4 + x^5 + x^7 + x^9 + x^{10} + x^{13}$$
$$\phi_3(x) = 1 + x + x^4 + x^7 + x^8 + x^{11} + x^{13}$$
$$\phi_4(x) = 1 + x + x^2 + x^3 + x^6 + x^8 + x^9 + x^{10} + x^{13}$$
$$g(x) = \prod_{i=1}^{4} \phi_i(x) =$$
$$g(x) = 1 + x + x^3 + x^5 + x^7 +$$
$$x^9 + x^{10} + x^{15} + x^{16} + x^{17} + x^{19} + x^{21} + x^{23} + x^{24} +$$
$$x^{25} + x^{30} + x^{36} + x^{37} + x^{41} + x^{44} + x^{46} + x^{50} + x^{52}$$

Figure 6:
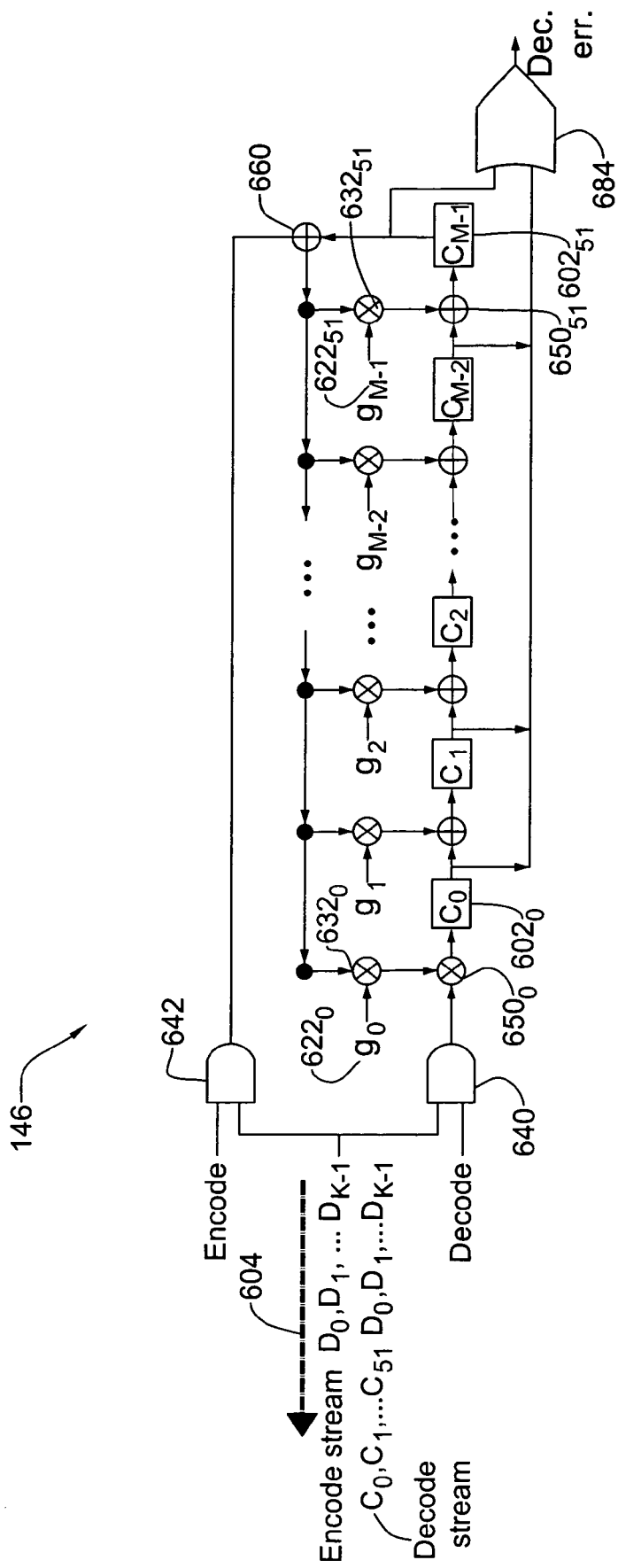
FIG. 6 is a hardware representation of a BCH encoder/decoder, according to an embodiment of the present invention.

FIG. 6 illustrates a hardware serial implementation of BCH encoder/decoder 146, according to an embodiment of the present invention. In the illustrated embodiment, the BCH algorithm is implemented one bit at a time. Multipliers $632_0$ through $632_{51}$ are multiplication operations using math on Galois Field (i.e., an AND logic function). Gates $650_0$ through $650_{51}$ and gate 660 represent an addition operation over the Galois Field (i.e., XOR functions). The values $g_0$ $622_0$ through $g_{m-1}$ $622_{51}$ correspond to the respective coefficients in the g(x) equation 1 above. During the encoding phase the encode input is set and the decode input is cleared, causing the input to be added at the output of $C_{51}602_{51}$, and during the decode phase the decode input is set and the encode input is cleared causing the input to be added at the input of $C_0 602_0$.

Before the BCH encoding phase starts, BCH encoder/decoder 146 is zeroed (i.e. $C_0 602_0$ through $C_{51} 602_{51}$ are cleared). In each clock cycle of the encoding, one bit of memory content $D_0$ through $D_{k-1}$ (including data 302, n1 322, and Hamming encoding syndrome 324) is entered at a time in the bit order indicated by arrow 604, so that for encoding, memory content bit $D_{k-1}$ is entered first. For each bit, the input data is 'added' to the previous state BCH encoder 146 via the logic function and latching of the result into the state registers ($C_0 602_0$ through $C_{51} 602_{51}$ corresponding to BCH storage 148). At the end of the process the state registers $C_0 602_0$ through $C_{51} 602_{51}$ hold the BCH encoding syndrome of the input data, which is then stored in flash 102 for a later use in the decode phase. The output of the BCH encoding phase is a 52 bit code stored into memory starting with bit $C_{51}$ $602_{51}$ down to bit $C_0$ $602_0$ with the last byte padded with four bits of 1 to a full 7-byte length for BCH 326 (FIG. 3).

During the BCH decoding phase, the inputted data is read from memory device 102. This read data includes the memory content used during the BCH encoding phase (i.e. $D_0$ through $D_{k-1}$ corresponding to data 302, n1 322, and the Hamming encoding syndrome 324) and the BCH encoding syndrome 326 computed during the BCH syndrome calculated during the encoding phase ($C_0$ $602_0$ through $C_{51}$ $602_{51}$). The read data may possibly include errors compared to the content used during the BCH encoding phase. The output (BCH decoding syndrome) of the decode phase is stored in $C_0$ $602_0$ through $C_{51}$ $602_{51}$. In case of an error in the data read, the verification syndrome has a value other than zero. This is detected by the OR gate 684 and indicated as a '1' on its output (Decoder Err).

Figure 7:
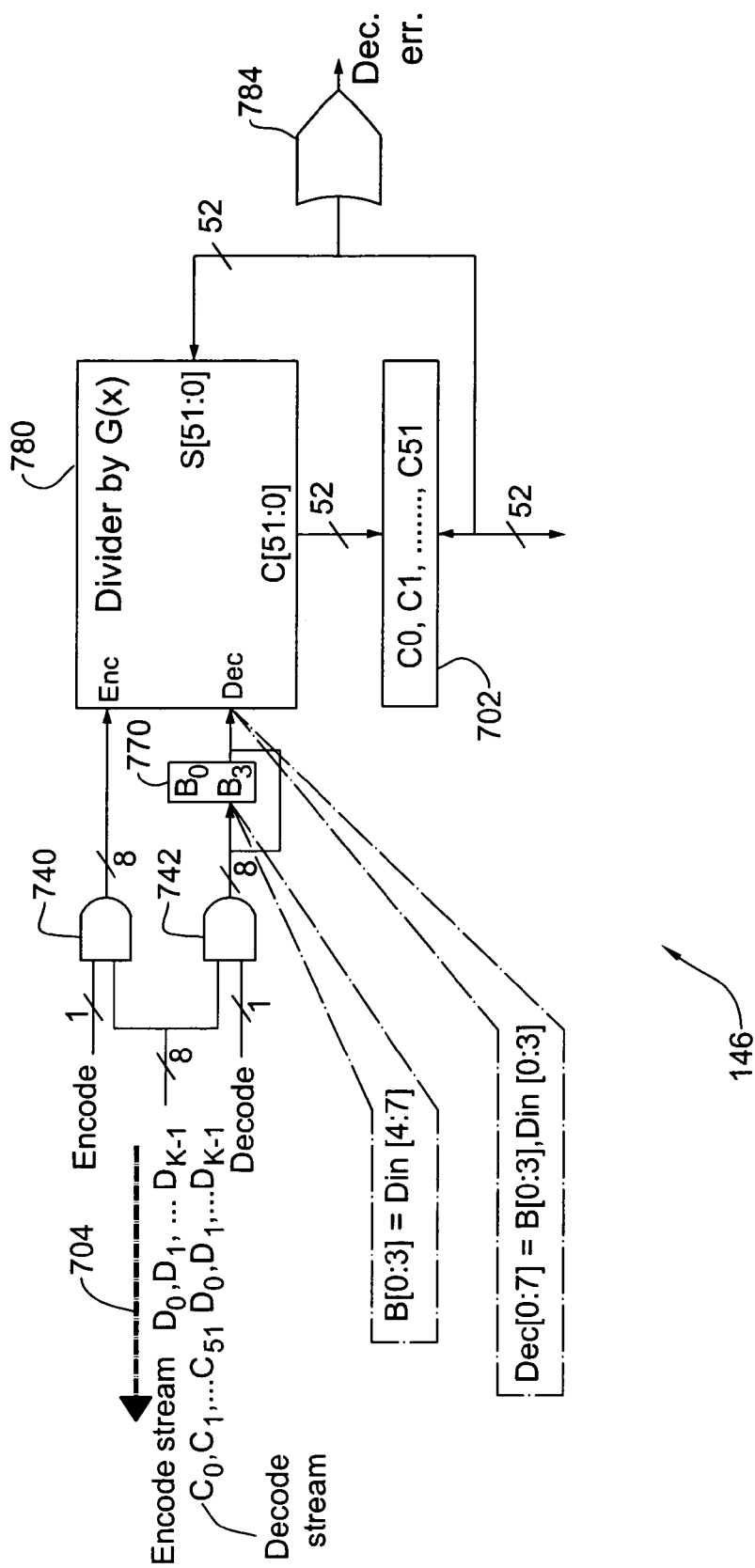
FIG. 7 is a hardware representation of a BCH encoder/decoder, according to another embodiment of the present invention.

FIG. 7 illustrates a hardware parallel implementation of BCH encoder/decoder 146, according to an embodiment of the present invention. In the illustrated embodiment, encoding or decoding is performed on 8 bits of memory content at a time. During the BCH encoding phase the encode input is set and the decode input is cleared, and during the decoding phase the decode input is set and the encode input is cleared.

During the BCH encoding phase, in each clock cycle eight bits of memory content $D_0$ through $D_{k-1}$ (including data 302, n1 322, and Hamming encoding syndrome 324) are entered at a time in the bit order indicated by arrow 704, i.e. data bits $D_{k-1}$ through $D_{k-8}$ are entered first.

The data is entered to the ENC input of the Encoder Divide Logic 780 and combined with the data from the previous phase $C_0$ to $C_{51}$ 702 (corresponding to BCH storage 148). The logic used for this operation is detailed in appendix A which shows the 8 bit Parallel BCH code encoder/decoder equations, according to an embodiment of the present invention. The result of this operation is stored back into $C_0$ to $C_{51}$ 702 as the temporal result for the next iteration of the encode operation. After all data is input, the encode phase is completed and the 52 bit encoding syndrome is stored in $C_0$ to $C_{51}$ 702.

During the BCH decoding phase, in each clock cycle 8 bits of memory content $D_0$ through $D_{k-1}$ used during the BCH encoding phase (including data 302, n1 322, Hamming 324) and/or 52 bits of BCH encoding syndrome 326 (i.e. $C_0$ through $C_{51}$) are entered at a time in the bit order indicated by arrow 704. A four-bit buffer 770 is placed in front of divider 780 in order to generate a 4-bit shift operation in the data stream, because the bits of data 302, n1 322 Hamming 324, and BCH 326 (without the last 4 bits) all together are not divisible by eight. The last 4-bits of BCH 326 which are fixed padding are removed by the shift operation. In other words the shift operation adds 4 bits of zero to the beginning of the decode stream (which do not impact the result) instead of the 4 bits at the end of 326 (which were not impacted by encoding and thus should not be part of the decode process). Buffer 770 is cleared along with registers 702.

During the BCH decoding phase, the data is entered to the DEC input of the Encoder Divide Logic 780 and combined with the data from the previous phase $C_0$ to $C_{51}$ 702. The logic used for this operation is detailed in appendix A which shows the 8 bit Parallel BCH code encoder/decoder equations, according to an embodiment of the present invention. The result of this operation is stored back into $C_0$-$C_{51}$ 702 as the temporal result for the next iteration of the decode operation. After all read data and the read syndrome ($C_{51}$-$C_0$) are input to the BCH decoder 146, the decode phase is completed and the 52 bit syndrome is stored in $C_0$-$C_{51}$ 702. A value of all zero in $C_0$-$C_{51}$ 702 indicates no error. Any other value indicates that there is an error in the read data. The OR gate 784 detects this error condition.

Figure 8:
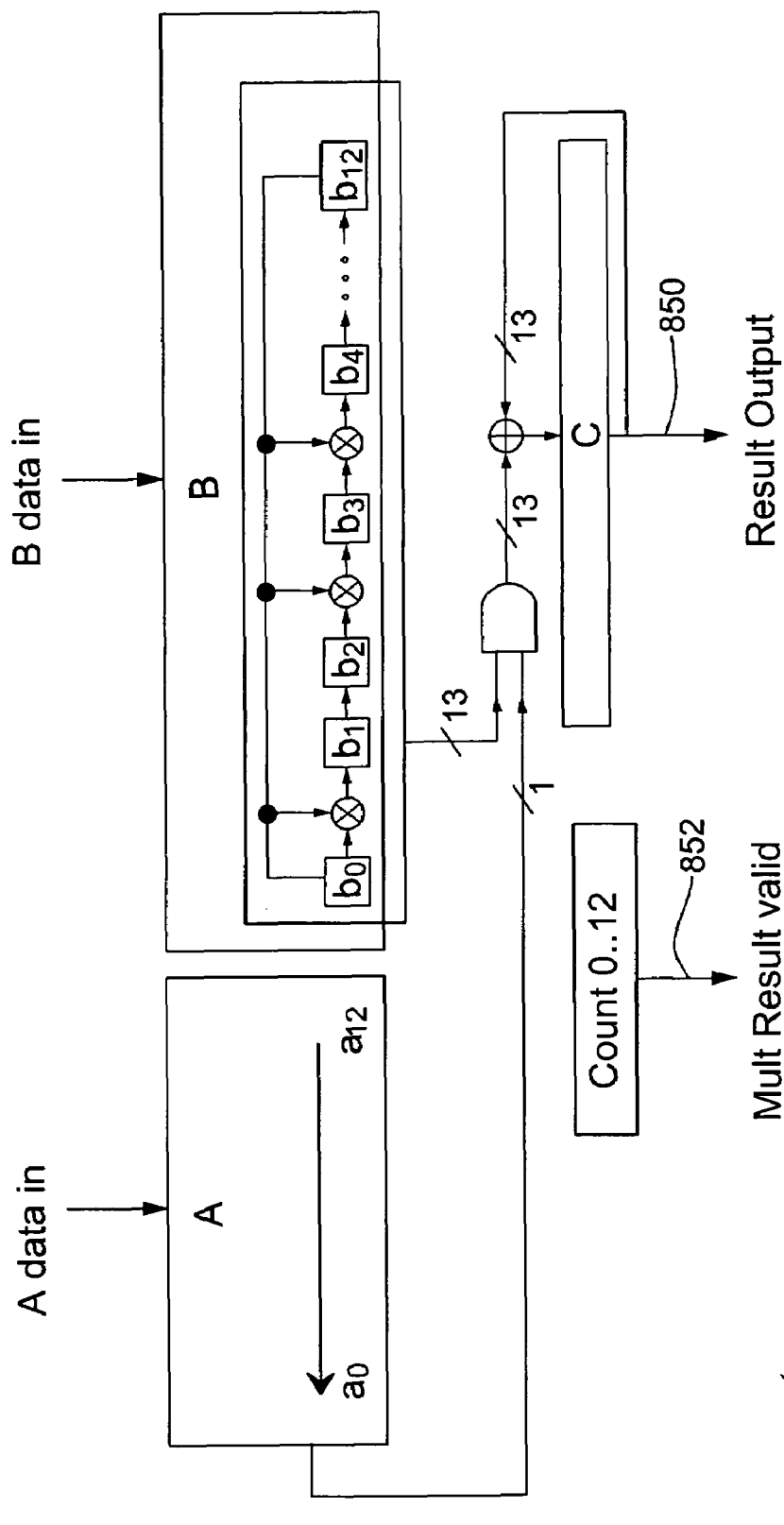
FIG. 8 is a hardware representation of a 13 bit serial multiplier in GF ($2^{13}$) according to an embodiment of the present invention.

FIG. 8 illustrates a hardware implementation 800 of a 13 bit semi-serial multiplier in Galois field ($2^{13}$). Galois field multiplication is known in the art and will therefore not be further elaborated on here. Implementation 800 can be used as part of calculations to be discussed later on. Serial multiplier hardware implementation 800 forms part of accelerator 152.

In operation, implementation 800 performs a multiply of two 13-bit numbers (A and B) into a 13 bit result C over a $2^{13}$ Galois field. The multiplication is started by a write of the input data into the input register A and B. This operation writes zeros into the "C" result and starts a 13-cycle process of shift, multiply (bit wise AND operation) and add (bit wise XOR operation) into "C" and rotating the "B" value (where the rotate is done over Galois field ($2^{13}$) thus including XOR operations as indicated in the diagram). Once the 13-clock cycles are completed, the result is available (represented by arrow 850) when the valid bit (represented by arrow 852) is set. Optionally, instead of a single write a separate write operation for each input may be used.

Figure 9:
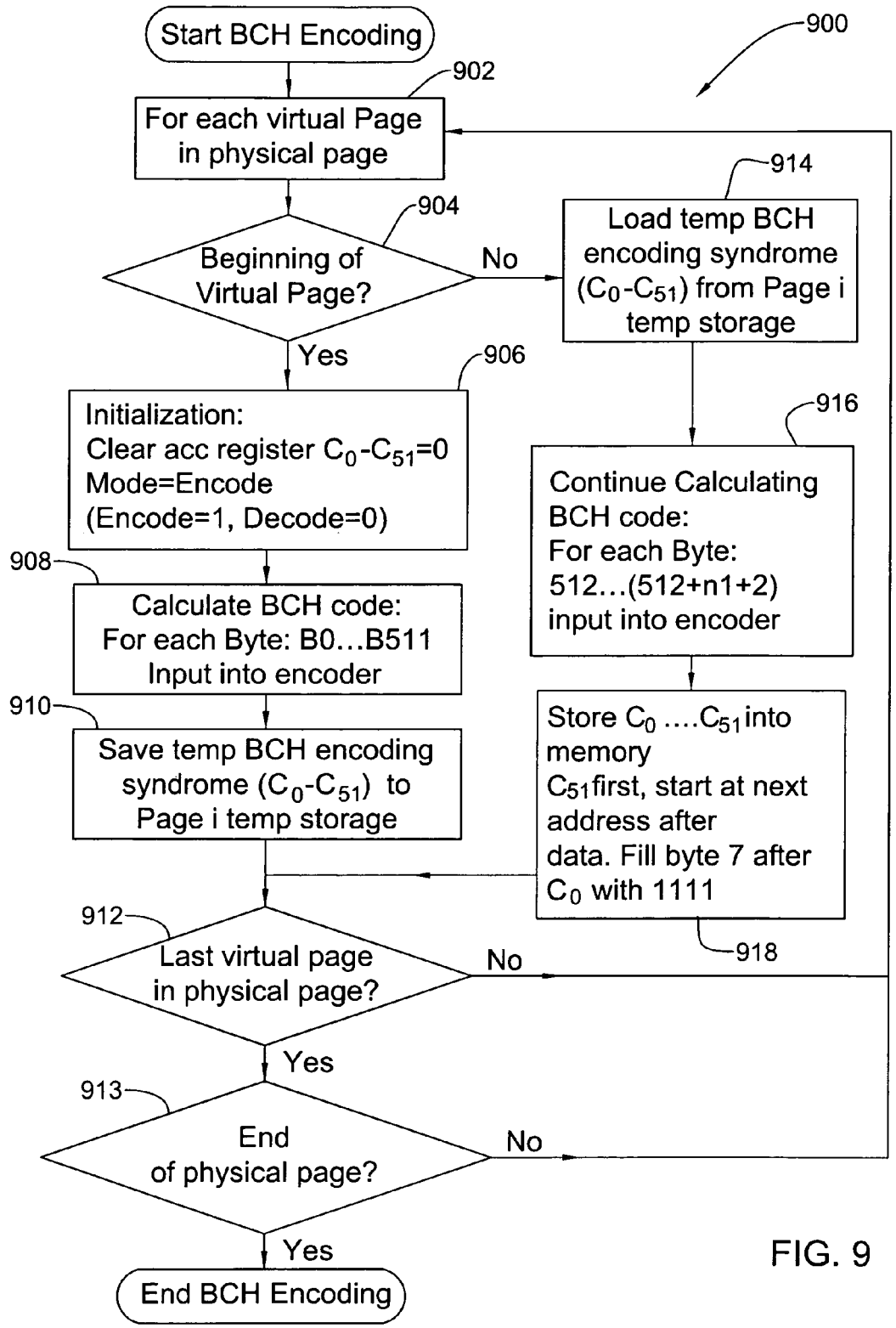
FIG. 9 is a flowchart of the generation of the BCH encoding syndrome using the circuit of FIG. 6 or 7, according to an embodiment of the present invention.

FIG. 9 is a flowchart of a method 900 for generation of the BCH code encoding syndrome using BCH encoder/decoder 146, according to an embodiment of the present invention and corresponding to stage 208. Method 900 can be used inter-alia with the implementations of BCH encoder/decoder 146 illustrated in FIG. 6 or 7. The illustrated embodiment 900 allows for interleaved operation on more than one virtual page (within a physical page). In stage 904, it is determined if the beginning of the virtual page i is being operated on. If yes, then in stage 906, registers $C_0$ through $C_{51}$ (corresponding to $602_0$ through $602_{51}$ in FIG. 6 or to 702 in FIG. 7) are cleared. The mode is set to encode so that encode=1 and decode=0. In stage 908, the BCH encoding syndrome is calculated for data 302. For example if hardware implementation 700 is used for BCH encoder/decoder 146, the calculation is on a byte to byte basis for the 512 bytes of data 302. In stage 910 the BCH code result (for data 302) is temporarily stored in storage 150. Once all data 302 for all the virtual pages have been encoded but not spare data 320 (no in stage 913), the BCH encoding of n1 322 and Hamming 324 proceeds for each virtual page. In stage 914, the temporarily stored BCH code result (for data 302) of the corresponding virtual page i is retrieved. In stage 916, the BCH code is calculated for n1 322 and Hamming 324. For example if hardware implementation 700 is used for BCH encoder/decoder 146, the calculation is on a byte to byte basis for the n1 data bytes+two hamming bytes (13-bit+5 bits of padding). In stage 918 the resulting BCH encoding syndrome is stored along with the padded ones (corresponding to stage 212 of method 200). The reader will understand that method 900 can be adapted to an embodiment where the physical page includes only one virtual page or an embodiment where the virtual pages are continuous in memory (i.e., virtual pages are not interleaved) by omitting stages 902, 904, 910 and 912, 913 and 914 and by proceeding with stages 916 through 918 directly after stage 908.

Once generation of Hamming and BCH encoding syndromes are complete, the data protected by the syndromes can be read and checked for errors by selectively using the calculated Hamming and BCH syndromes.

Figure 10:
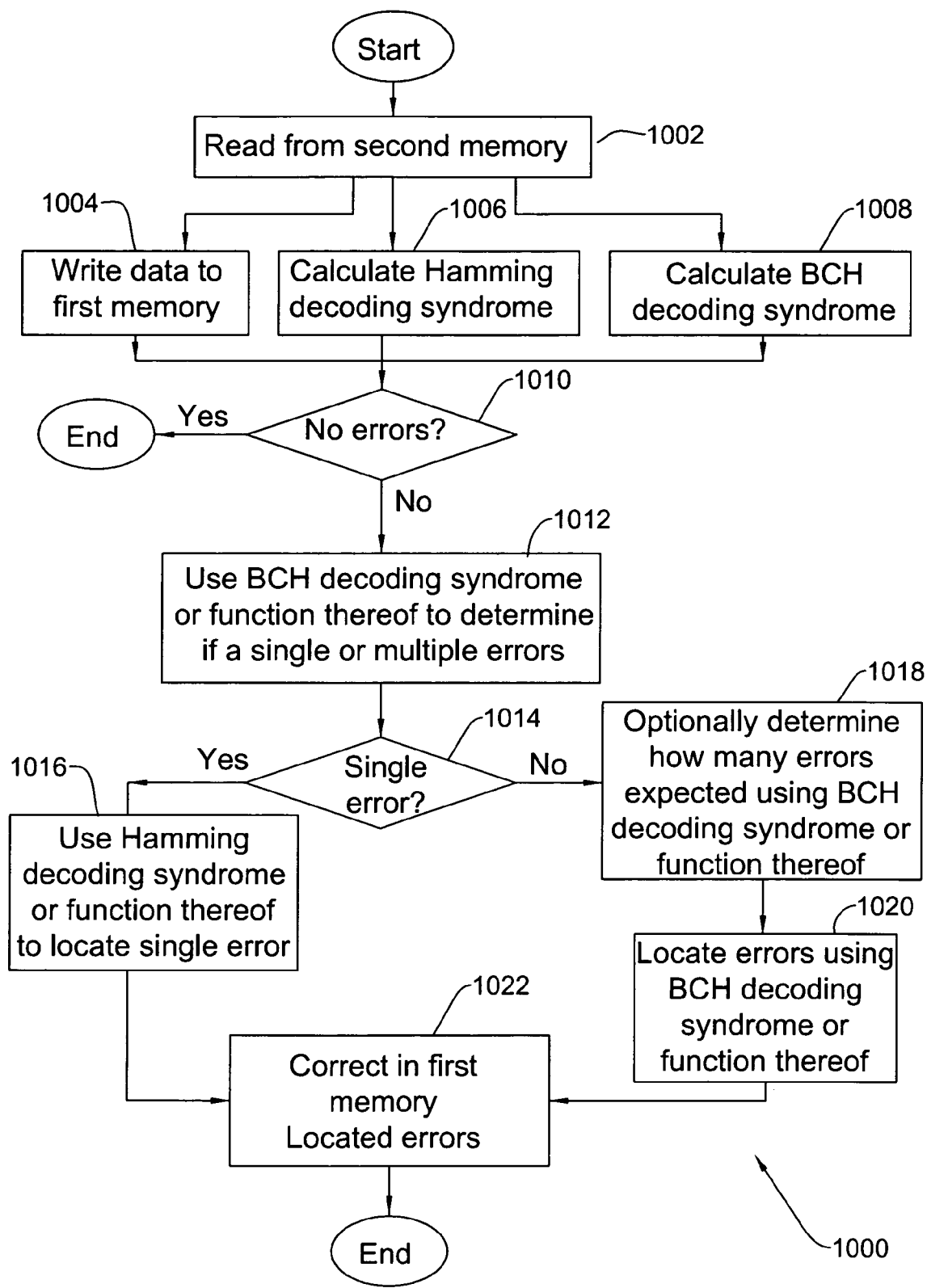
FIG. 10 is a flowchart of a method for reading data from memory, including error correction decoding, according to an embodiment of the present invention.

FIG. 10 is a flowchart of a method 1000 for reading data from memory, including error correction decoding according to an embodiment of the present invention.

In stage 1002, data 302, n1 322, Hamming 324 and BCH 326 are read from the second memory, flash device 102. As the read data passes through nand flash controller 140, a Hamming decoding syndrome (stage 1006) and a BCH decoding syndrome (stage 1008) are calculated (i.e. syndrome verification is performed). As illustrated in FIG. 3, Hamming code verification 352 (corresponding to stage 1006) is performed using data 302, n1 322 and Hamming 324 whereas BCH code verification 356 (corresponding to stage 1008) is performed using data 302, n1 322, Hamming 324 and BCH 326. In stage 1004, data 302 and n1 322 are written to first memory, CPU memory 106. Optionally, Hamming 324, BCH 326 and n2 328 may also be written. If no errors are found in stage 1010 (i.e. the BCH decoding syndrome from stage 1008 is zero) then method 1000 ends. Note that if the BCH decoding syndrome is zero, the Hamming decoding syndrome (from stage 1006) is assumed to also be zero in one embodiment. In another embodiment, method 1000 checks whether both the BCH decoding syndrome (from stage 1008) and the Hamming decoding syndrome (from stage 1006) are zero when determining whether no errors are found.

If the BCH decoding syndrome is not zero, then method 1000 continues with stage 1012 where the BCH decoding syndrome or a function thereof is used to determine whether there is a single error or a plurality of errors. If there is a single error, then the Hamming decoding syndrome or a function thereof is used to locate the single error in stage 1016. If there is a plurality of errors, then in optional stage 1018, the BCH decoding syndrome or a function thereof is used to determine how many errors (greater than 1) are expected. In stage 1020, the errors are located using the BCH decoding syndrome or a function thereof. Regardless of how the errors are located, in stage 1022 the located errors can be corrected, for example while in the first memory. The correction includes, for example, toggling the erroneous bits, whose location was found above, i.e. a bit which is one to zero and vice versa, for example by XOR'ing the error bit with a "1".

Figure 11:
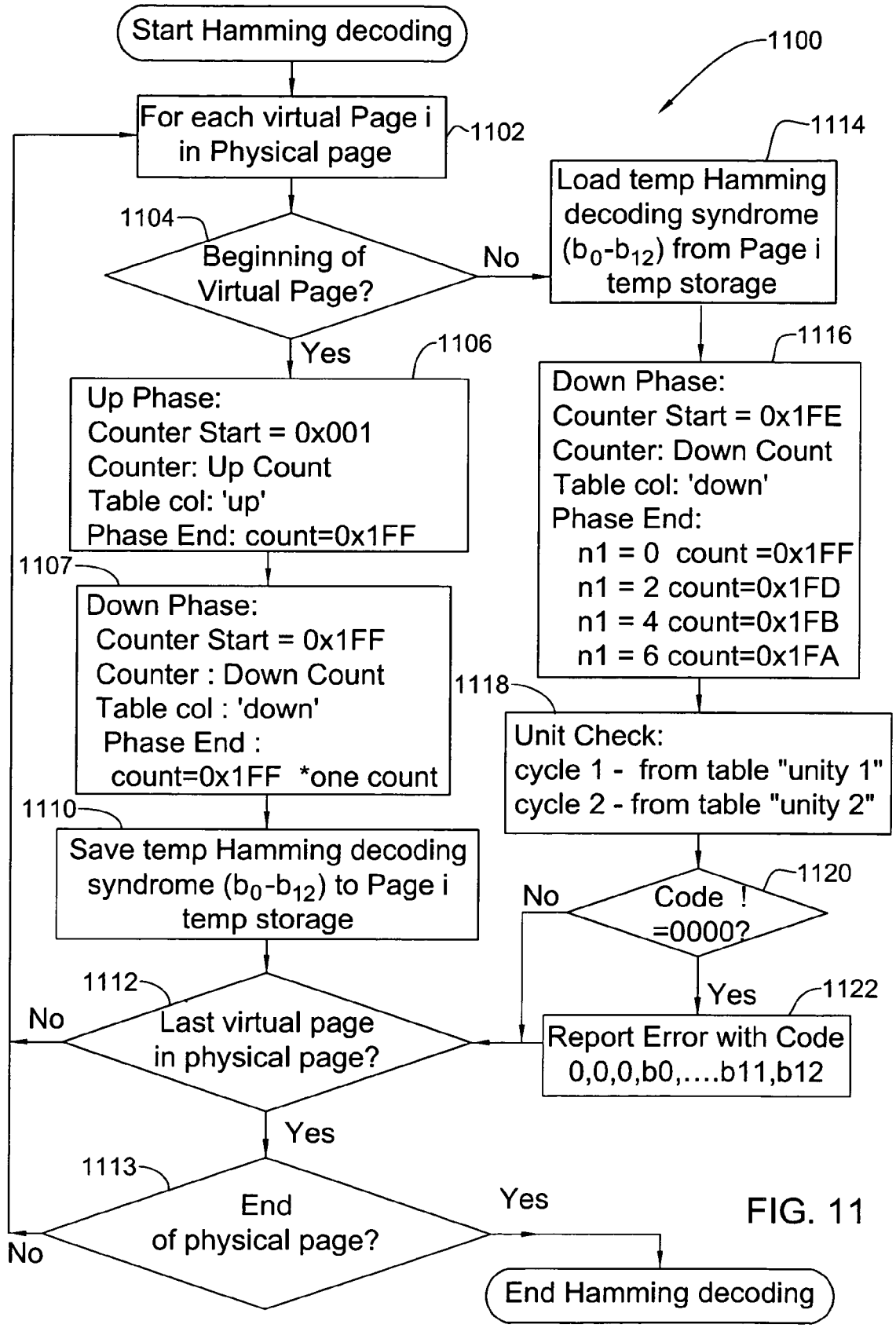
FIG. 11 is a flowchart of a method of generation of Hamming decoding syndrome), according to an embodiment of the present invention.

FIG. 11 is a method 1100 for Hamming verification (i.e. generation of the Hamming decoding syndrome) using Hamming encoder/decoder 142, according to an embodiment of the present invention. Method 1100 in one embodiment corresponds to stage 1006. Similarly to what was described above with reference to FIG. 5, method 1100 can be performed using for example the hardware representation of Hamming encoder/decoder 142 illustrated in FIG. 4, where the AND-XOR table 408 can be defined as in table 1. The illustrated embodiment 1100 allows for interleaved operation on more than one virtual page (within a physical page). In stage 1104, it is determined if the beginning of the virtual page i is being operated on. If yes, then in stage 1106 counter 404 counts up in accordance with column 2 of table 1. The count ends at 0x1FF inclusive. Stage 1106 is followed with stage 1107 count down, which is executed for a single data input and a counter value of 0x1FF. In stage 1110 the Hamming decoding result (for data 302) is temporarily stored in storage 150. Once all data 302 for all the virtual pages have been decoded but the spare data 320 has not yet been decoded (no in stage 1113), the decoding of n1 322 and hamming 324 proceeds for each virtual page. In stage 1114, the stored Hamming decoding result of the corresponding virtual page i is retrieved. In stage 1116, counter 404 counts down in accordance with column 3 of table 1, starting in value 0x1FE. The end of the count depends on the number of bytes of n1 322 in virtual page i. (For example, note that if n1=0, this step includes zero operations). In stage 1118, the 13-bit stored Hamming encoding syndrome 324 is checked in two clock cycles, where the first cycle is governed by column 4 of table 1 and the second cycle is governed by column 5 of table 1. (Note that the padding bits that augmented the syndrome to 2 bytes are ignored). If the Hamming decoding syndrome is zero in stage 1120, then no error has occurred and method 1100 continues for any following virtual pages. If the Hamming decoding syndrome is nonzero in stage 1120, then the resulting Hamming decoding syndrome is reported along with the padded zeros. For example the Hamming decoding syndrome may be put in a register and the software may be notified that error correction is required. Alternatively, the Hamming decoding syndrome may be stored in temporary storage 150 or the corresponding virtual page until the other virtual pages are handled and later copied into a register when the software may need it. The reader will understand that method 1100 can be adapted to an embodiment where the physical page included only one virtual page or when virtual pages are continuous in memory by omitting stages 1102, 1104, 1110 and 1112, 1113 and 1114 and proceeding with stages 1116 through 1122 directly after stage 1107.

Figure 12:
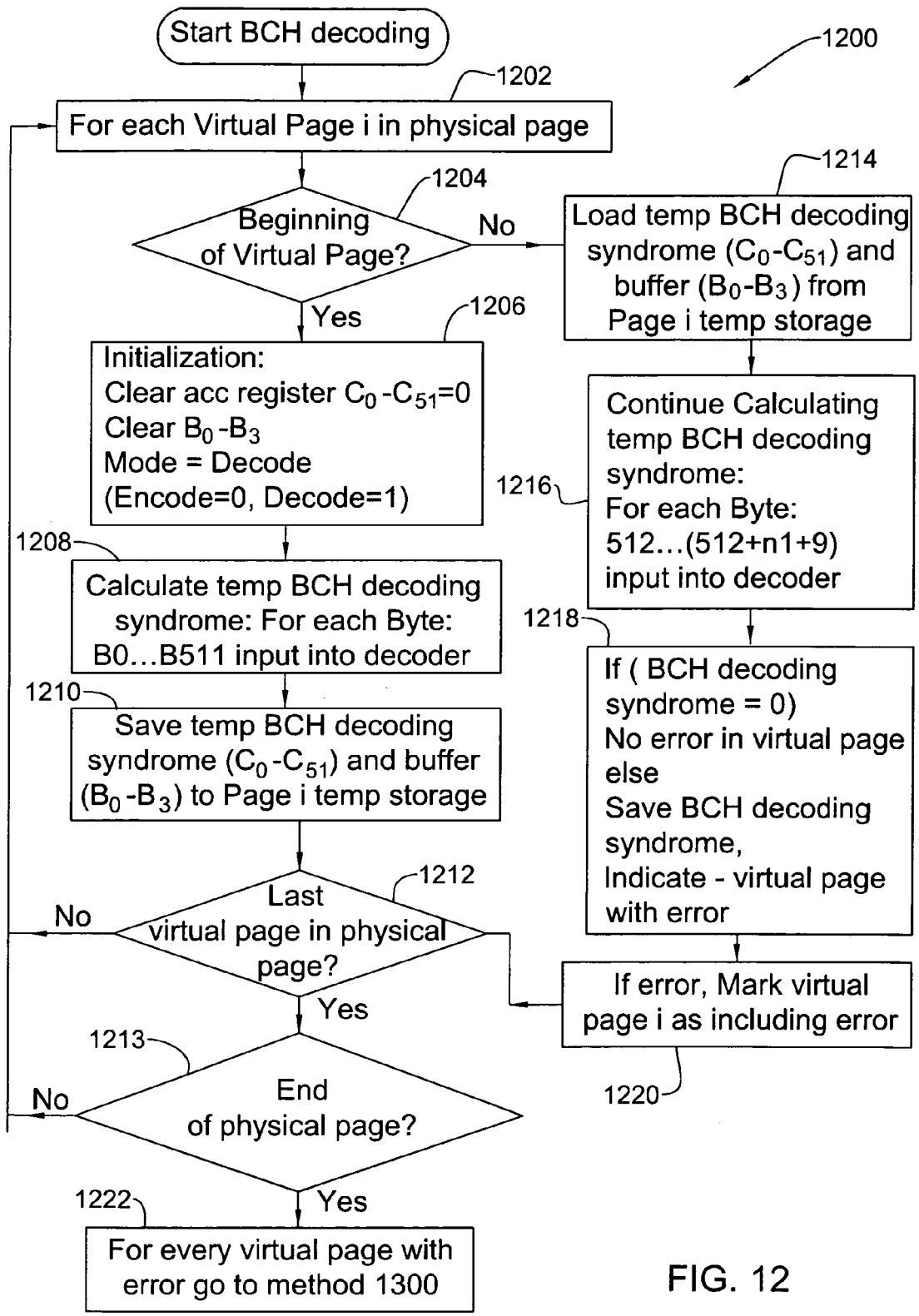
FIG. 12 is a flowchart of a method of generation of BCH decoding syndrome), according to an embodiment of the present invention.

FIG. 12 is a flowchart of a method 1200 for BCH verification, i.e. generation of the BCH decoding syndrome using BCH encoder/decoder 146, according to an embodiment of the present invention. In one embodiment, method 1200 corresponds to stage 1008. The illustrated embodiment 1200 allows for interleaved operation on more than one virtual page (within a physical page). In stage 1204, it is determined if the beginning of the virtual page i is being operated on. If yes, then in stage 1206, registers $C_0$ through $C_{51}$ (corresponding to $602_0$ through $602_{51}$ in FIG. 6 or to 702 in FIG. 7) are cleared and if buffer 770 is used, $B_0$ through $B_3$ of buffer 770 are also cleared. The mode is set to decode so that decode=1 and encode=0. In stage 1208, the BCH decoding syndrome is calculated for data 302. For example if hardware implementation 700 is used for BCH encoder/decoder 146, the calculation is on a byte to byte basis for the 512 bytes of data 302. In stage 1210 the BCH interim decoding result (for data 302) and the values in $B_0$ through $B_3$ of buffer 770 (type of state data) are temporarily stored in storage 150. Once all data 302 for all the virtual pages have been decoded but spare data 320 has not been decoded (no in stage 1213), the decoding of n1 322, Hamming 324, and BCH 326 proceeds for each virtual page. In stage 1214, the temporarily stored BCH decoding result and buffer $B_0$ to $B_3$ of the corresponding virtual page i is retrieved. For example if hardware implementation 700 is used for BCH encoder/decoder 146, the calculation is on a byte to byte basis for the n1+2 (Hamming)+52 bits (BCH) of data—(where the additional 4 bits of BCH that are in buffer 770 are ignored as explained above). In stage 1216, the BCH decoding syndrome is calculated for n1 322, Hamming 324, and BCH encoding syndrome 326. In stage 1218, if the BCH decoding syndrome is zero then there is no error in the virtual page. Otherwise an error is marked for this virtual page in stage 1220. For example the BCH decoding syndrome may be put in a register and the software may be notified that error correction is required. Alternatively, the BCH decoding syndrome may be stored in temporary storage 150 for the corresponding virtual page until the other virtual pages are handled and later copied into a register when the software may need the syndrome. Once the decoding has been completed for all virtual pages (yes in stage 1213), stage 1222 leads to method 1300 being executed for every virtual page with a marked error. The reader will understand that method 1200 can be adapted to an embodiment where the physical page included only one virtual page or the virtual pages are continuous in memory by omitting stages 1202, 1204, 1210 and 1212, 1213 and 1214 and by proceeding with stage 1216 directly after stage 1208.

Figure 13:
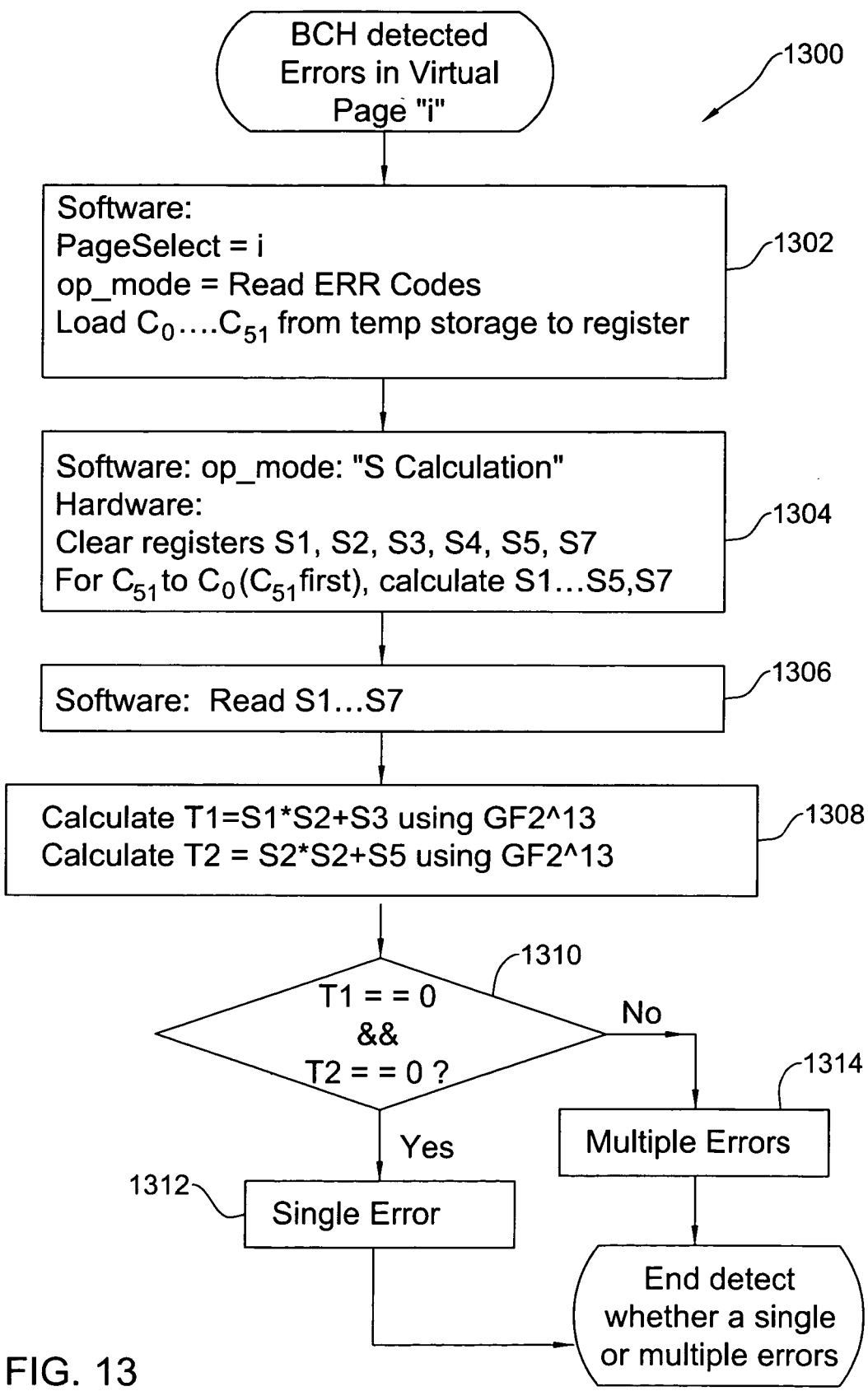
FIG. 13 is a flowchart of a method for using the BCH decoding syndrome to detect whether there is a single or multiple errors, according to an embodiment of the present invention.

For any virtual page with a flagged error (i.e. BCH decoding syndrome was not zero and corresponding to "no" leading from stage 1010), stage 1222 leads to method 1300 of FIG. 13 (corresponding to stage 1012) for detecting single or multiple errors. Prior to executing method 1300, it is known that there is at least one error but not the number of errors.

FIG. 13 is a flowchart of a method 1300 for using the BCH decoding syndrome or a function thereof to detect whether there is a single or multiple errors, according to an embodiment of the present invention.

Method 1300 will be discussed with reference to software routines and to FIG. 14 which is a hardware implementation of an S calculation and chain root finder accelerator (part of accelerator 152), according to an embodiment of the present invention.

In optional stage 1302, the BCH decoding syndrome $C_0$ to $C_{51}$ is read from temporary storage 150 of page i and put into a shift register. In one embodiment, this shift register utilizes flip-flops in BCH result register 602 or 702 so as to operate as a shift register. In stage 1304, the BCH decoding syndrome $C_0$ to $C_{51}$ is read from BCH result register 148, beginning with $C_{51}$ and used to calculate $S_1$, $S_2$, $S_3$, $S_4$, $S_5$ and $S_7$. For example, the calculation of all 6 "S" values may be calculated in parallel using logic $1402_1$, logic $1402_2$, logic $1402_3$, logic $1402_4$, logic $1402_5$ and logic $1402_7$ detailed in Appendix B. The logic detailed in Appendix B are equations that link the inputs of 1402 $1402_1$, logic $1402_2$, logic $1402_3$, logic $1402_4$, logic $1402_5$ and logic $1402_7$ (for $S_1$, $S_2$, $S_3$, $S_4$, $S_5$ and $S_7$) to the output. These equations represent the combinatorial part of a state machine that includes result register 148 and this logic block. In each stage of the state machine, the state is changed based on the current state and possibly (in the S calculation process) the data bit in the output of the AND gate 1410. The math functions are driven by the mathematical operations that generates the 'S' values and the operations that calculates the 'chain search'. Once the accelerator status indicates completion, after for example approximately 52 clock cycles, the S data is read from S registers $1404_1$, $1404_2$, $1404_3$, $1404_4$, $1404_5$ and $1404_7$ in stage 1306. The calculated $S_1$, $S_2$, $S_3$, $S_4$, $S_5$ and $S_7$ are used to calculate $T_1$ and $T_2$ in stage 1308, where "+" indicates XOR operations in all math and "*" indicates multiply operation using math on Galois field $2^{13}$, for example using multiplier 800 of FIG. 8. Multiplier 800 for example may give a valid result approximately 13 clock cycles after the write with the read stalling until the result is valid. If $T_1$ equals zero and $T_2$ equals zero in stage 1310 then there is a single error (stage 1312). Otherwise there are multiple errors (stage 1314).

Assuming there is a single error, the Hamming decoding syndrome calculated in method 1100 or a function thereof is used to locate the error (corresponding to stage 1016). For example in one embodiment of the invention the following software routine can be used to locate the bit position of the error.

```
////////     FindVectorLocation
///////////////////////////////////
// The output of the routine is an index to the bit
position of
// the error bit. MatSize depends on 'n1' and should be
//                n1 = 0 = 4109
//                n1 = 2 = 4125
//                n1 = 4 = 4141
//                n1 = 6 = 4147
int  FindVectorLocation (field VectorCode)
{
    if (VectorCode & 0x1 ) // View the most
significant bit
    {
        if (VectorCode == 0x1 )     return MatSize-1;
        else.               return ((VectorCode >>1 ) −
8);
    }
    else {
        field tmpVectorCode = VectorCode >>1;
        for (int l=0 ;i<12; i++)
            if (tmpVectorCode == (0x1 <<(11−i)) )
                return (MatSize−13+i);
        return (4088 + (0x1 <<12)−1 − tmpVectorCode);
    }
}
```

If multiple errors were detected then optionally the exact number of errors can be detected using the BCH decoding syndrome or a function thereof (corresponding to stage 1018). The advantage of detecting the number of errors is that in stage 1020 (error locating), only the detected number of errors need be located, and thus the time to execute stage 1020 is shortened in most cases. The performance of stage 1018 is advantageous in many cases because the time and/or computational complexity for detecting the number of errors using the BCH decoding syndrome or a function thereof is in many cases less than the time and/or computational complexity of locating the errors using the BCH decoding syndrome or a function thereof.

Figure 15:
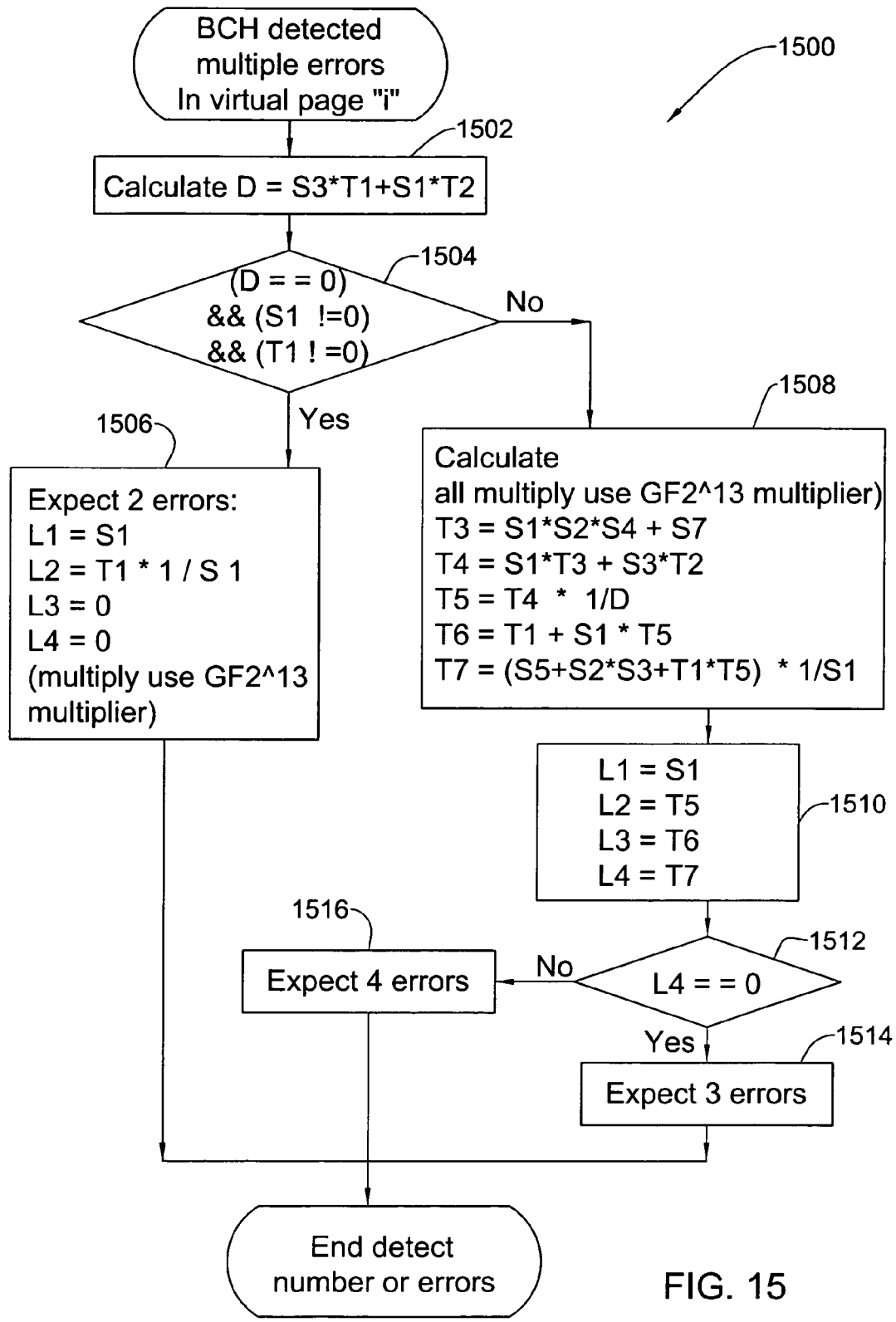
FIG. 15 is a flowchart of a method for detecting the number of errors greater than one, according to an embodiment of the present invention.
Figure 16:
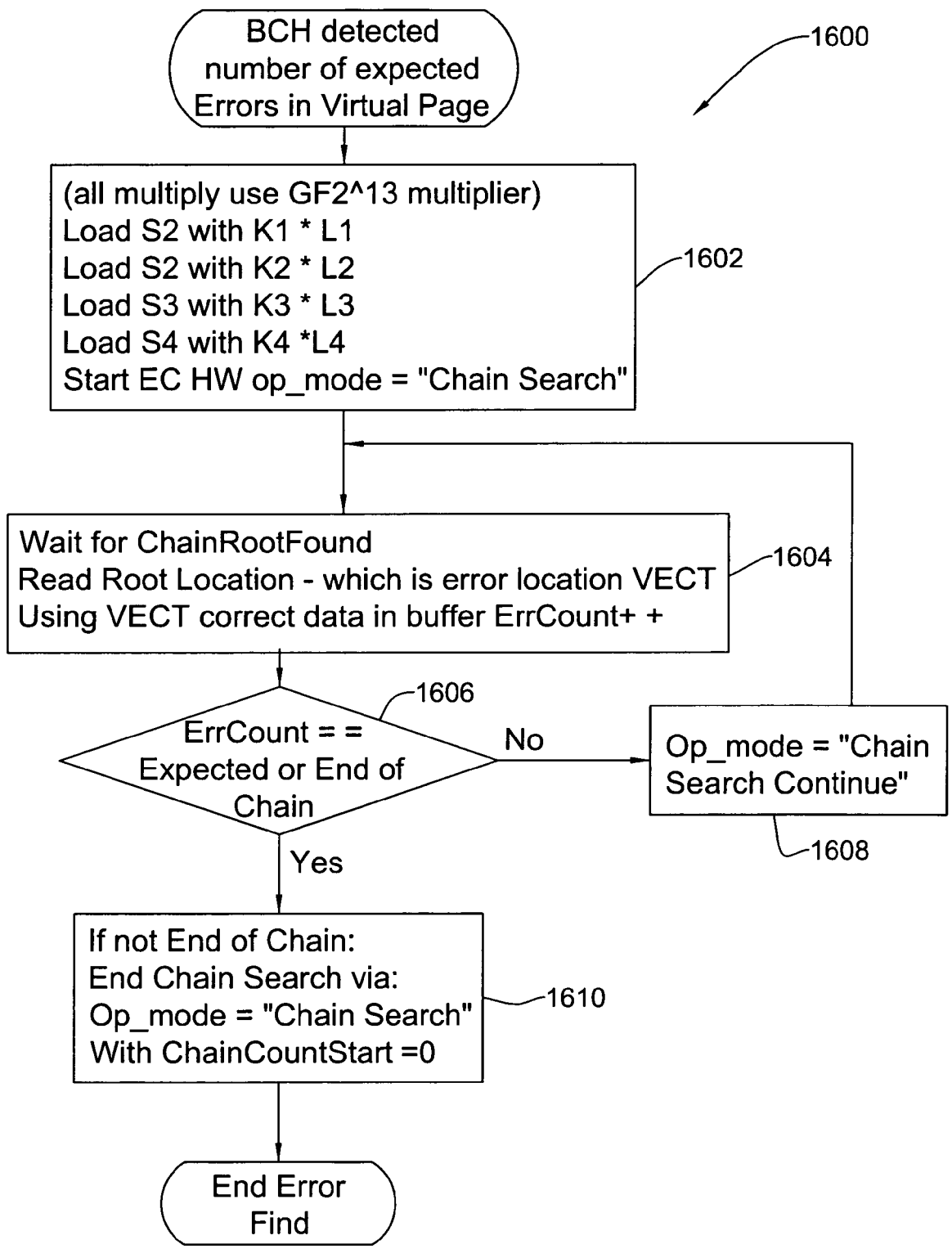
FIG. 16 is a flowchart of a method for locating the plurality of detected errors, according to an embodiment of the present invention.

FIG. 15 is a flowchart of method 1500 for detecting the number of multiple errors, according to an embodiment of the present invention. In the described embodiment it is assumed that only a maximum of 4 errors can exist per virtual page, however in other embodiments using other types of error correction schemes a number other than 4 errors may be handled. As mentioned above '+' indicates bit wise XOR operations. Also as mentioned above, '*' indicates multiply operations using Galois $2^{13}$ field for example using hardware implementation 800. Here also, 1/x is an inverse operation over the Galois field $2^{13}$. The math for performing this operation is R(x)*P(x)=1 Mod M(x) where M(x) is a constant being equal to $\phi_1(x)$ defined above. R(x) is the input value and P(x) is the result of the inverse operation Once the number of expected errors has been identified, the errors are located, for example in one embodiment using method 1600 illustrated in FIG. 16 (corresponding to stage 1020)

Figure 14:
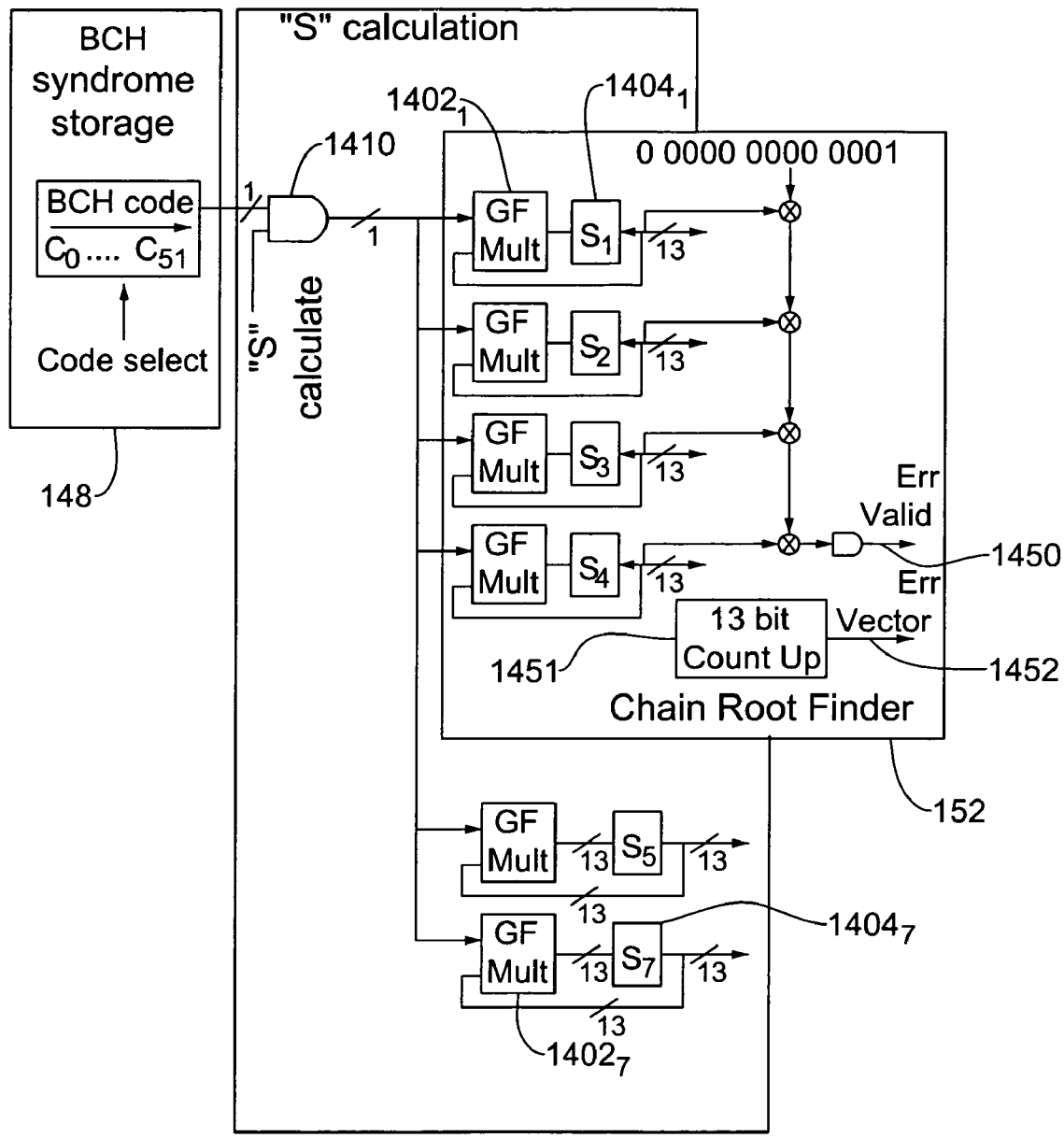
FIG. 14 is a hardware representation of an S calculation and chain root finder accelerator, according to an embodiment of the present invention.

Method 1600 will be described in conjunction with the hardware implementation of accelerator 152 that is illustrated in FIG. 14. Process 1600 takes as an input four parameters L1, L2, L3 and L4 which are written into S registers 1404$_1$, 1404$_2$, 1404$_3$, 1404$_4$ scaled by constants K1, K2, K3 and K4 respectively (stage 1602). The values of the constants in one embodiment are shown below in table 2.

TABLE 2

Chain Search Parameters for various n1 values

| N1_COUNT | CHAIN_COUNT_START | K1 | K2 | K3 | K4 |
|---|---|---|---|---|---|
| 0 | 4164 | 0x19C4 | 0x1EBF | 0x033D | 0x05C2 |
| 2 | 4180 | 0x0B4C | 0x05F3 | 0x12CE | 0x186B |
| 4 | 4196 | 0x1937 | 0x0B8C | 0x1298 | 0x15C5 |
| 6 | 4212 | 0x13D4 | 0x0AC4 | 0x01AB | 0x055D |

In this phase the 'S calculate' bit in FIG. 13 is '0' causing the output of the AND to logic 1402$_1$ 1402$_2$, 1402$_3$, and 1402$_4$ to be 0. A 13-bit up counter 1451 is cleared (put to zero). The output of S registers 1404$_1$, 1404$_2$, 1404$_3$, 1404$_4$ are added together with a constant of "1" using a bit wise XOR of the respective bits of each value held in registers S$_1$ 1404$_1$, S$_2$ 1404$_2$, S$_3$ 1404$_3$ and S$_4$ 1404$_4$. If the result of the XOR operation is a zero (i.e. error valid 1450 is zero), then the chain search process has found the location of an error and the error location is ERR_INDEX=CHAIN_COUNT_START−CHAIN_SEARCH_ERR. In this case the value in the counter 1451 is CHAIN_SEARCH_ERR and CHAIN_COUNT_START as defined in table 2. The ERR_INDEX (i.e. error vector 1452) is the bit position from the beginning of the virtual page. e.g., ERR_INDEX=0 means bit 0 of byte 0 of data 302. In stage 1606, if additional errors are expected (or until the number of iteration has reached the CHAIN_COUNT_START value), then the chain search continues in stage 1608 with the performance of an 'S' value update state. In this stage the value in S$_1$ register 1404$_1$ is updated with the result of logic 1402 (as defined in Appendix B for S$_1$) on the previous value of S$_1$. Similarly S$_2$ S$_3$, and S$_4$ are updated, and then the XOR operation is performed again.

Otherwise, if no additional errors are expected the chain search ends in stage 1610 with the expected number of errors located.

Once the errors have been located, the errors can be corrected—see above description of stage 1022.

While the invention has been shown and described with respect to particular embodiments, it is not thus limited. Numerous modifications, changes and improvements within the scope of the invention will now occur to the reader.

APPENDIX A

8-BIT PARALLEL BCH ENCODER/DECODER EQUATIONS

C(0) = Denc(7) + Denc(5) + Denc(3) + S(44) + S(46) + S(48) + Ddec(7);
C(1) = Denc(7) + Denc(6) + Denc(5) + Denc(4) + Denc(3) + Denc(2) + S(44) + S(45) + S(46) + S(47) + S(48) + S(49) + Ddec(6);
C(2) = Denc(6) + Denc(5) + Denc(4) + Denc(3) + Denc(2) + Denc(1) + S(45) + S(46) + S(47) + S(48) + S(49) + S(50) + Ddec(5);
C(3) = Denc(7) + Denc(4) + Denc(2) + Denc(1) + S(44) + S(47) + S(49) + S(50) + S(51) + Denc(0) + Ddec(4);
C(4) = Denc(6) + Denc(3) + Denc(1) + S(45) + S(48) + S(50) + S(51) + Denc(0) + Ddec(3);
C(5) = Denc(7) + Denc(3) + Denc(2) + S(44) + S(48) + S(49) + S(51) + Denc(0) + Ddec(2);
C(6) = Denc(6) + Denc(2) + Denc(1) + S(45) + S(49) + S(50) + Ddec(1);
C(7) = Denc(7) + Denc(3) + Denc(1) + S(44) + S(48) + S(50) + S(51) + Denc(0) + Ddec(0);
C(8) = Denc(6) + Denc(2) + S(0) + S(45) + S(49) + S(51) + Denc(0);
C(9) = Denc(7) + Denc(3) + Denc(1) + S(1) + S(44) + S(48) + S(50) ;
C(10) = Denc(7) + Denc(6) + Denc(5) + Denc(3) + Denc(2) + S(2) + S(44) + S(45) + S(46) + S(48) + S(49) + S(51) + Denc(0);
C(11) = Denc(6) + Denc(5) + Denc(4) + Denc(2) + Denc(1) + S(3) + S(45) + S(46) + S(47) + S(49) + S(50);
C(12) = Denc(5) + Denc(4) + Denc(3) + Denc(1) + S(4) + S(46) + S(47) + S(48) + S(50) + S(51) + Denc(0);

APPENDIX A-continued

8-BIT PARALLEL BCH ENCODER/DECODER EQUATIONS

C(13) = Denc(4) + Denc(3) + Denc(2) + S(5) + S(47) + S(48) + S(49) + S(51) + Denc(0);
C(14) = Denc(3) + Denc(2) + Denc(1) + S(6) + S(48) + S(49) + S(50);
C(15) = Denc(7) + Denc(5) + Denc(3) + Denc(2) + Denc(1) + S(7) + S(44) + S(46) + S(48) + S(49) + S(50) + S(51) + Denc (0);
C(16) = Denc(7) + Denc(6) + Denc(5) + Denc(4) + Denc(3) + Denc(2) + Denc(1) + S(8) + S(44) + S(45) + S(46) + S(47) + S(48) + S(49) + S(50) + S(51) + Denc(0);
C(17) = Denc(7) + Denc(6) + Denc(4) + Denc(2) + Denc(1) + S(9) + S(44) + S(45) + S(47) + S(49) + S(50) + S(51) + Denc(0);
C(18) = Denc(6) + Denc(5) + Denc(3) + Denc(1) + S(10) + S(45) + S(46) + S(48) + S(50) + S(51) + Denc(0);
C(19) = Denc(7) + Denc(4) + Denc(3) + Denc(2) + S(11) + S(44) + S(47) + S(48) + S(49) + S(51) + Denc(0);
C(20) = Denc(6) + Denc(3) + Denc(2) + Denc(1) + S(12) + S(45) + S(48) + S(49) + S(50);
C(21) = Denc(7) + Denc(3) + Denc(2) + Denc(1) + S(13) + S(44) + S(48) + S(49) + S(50) + S(51) + Denc(0) ;
C(22) = Denc(6) + Denc(2) + Denc(1) + S(14) + S(45) + S(49) + S(50) + S(51) + Denc(0);
C(23) = Denc(7) + Denc(3) + Denc(1) + S(15) + S(44) + S(48) + S(50) + S(51) + Denc(0);
C(24) = Denc(7) + Denc(6) + Denc(5) + Denc(3) + Denc(2) + S(16) + S(44) + S(45) + S(46) + S(48) + S(49) + S(51) + Denc(0);
C(25) = Denc(7) + Denc(6) + Denc(4) + Denc(3) + Denc(2) + Denc(1) + S(17) + S(44) + S(45) + S(47) + S(48) + S(49) + S(50);
C(26) = Denc(6) + Denc(5) + Denc(3) + Denc(2) + Denc(1) + S(18) + S(45) + S(46) + S(48) + S(49) + S(50) + S(51) + Denc(0);
C(27) = Denc(5) + Denc(4) + Denc(2) + Denc(1) + S(19) + S(46) + S(47) + S(49) + S(50) + S(51) + Denc(0);
C(28) = Denc(4) + Denc(3) + Denc(1) + S(20) + S(47) + S(48) + S(50) + S(51) + Denc(0);
C(29) = Denc(3) + Denc(2) + S(21) + S(48) + S(49) + S(51) + Denc (0);
C(30) = Denc(7) + Denc(5) + Denc(3) + Denc(2) + Denc(1) + S(22) + S(44) + S(46) + S(48) + S(49) + S(50);
C(31) = Denc(6) + Denc(4) + Denc(2) + Denc(1) + S(23) + S(45) + S(47) + S(49) + S(50) + S(51) + Denc(0);
C(32) = Denc(5) + Denc(3) + Denc(1) + S(24) + S(46) + S(48) + S(50) + S(51) + Denc(0);
C(33) = Denc(4) + Denc(2) + S(25) + S(47) + S(49) + S(51) + Denc(0);
C(34) = Denc(3) + Denc(1) + S(26) + S(48) + S(50);
C(35) = Denc(2) + S(27) + S(49) + S(51) + Denc(0);
C(36) = Denc(7) + Denc(5) + Denc(3) + Denc(1) + S(28) + S(44) + S(46) + S(48) + S(50);
C(37) = Denc(7) + Denc(6) + Denc(5) + Denc(4) + Denc(3) + Denc(2) + S(29) + S(44) + S(45) + S(46) + S(47) + S(48) + S(49) + S(51) + Denc(0);
C(38) = Denc(6) + Denc(5) + Denc(4) + Denc(3) + Denc(2) + Denc(1) + S(30) + S(45) + S(46) + S(47) + S(48) + S(49) + S(50);
C(39) = Denc(5) + Denc(4) + Denc(3) + Denc(2) + Denc(1) + S(31) + S(46) + S(47) + S(48) + S(49) + S(50) + S(51) + Denc(0);
C(40) = Denc(4) + Denc(3) + Denc(2) + Denc(1) + S(32) + S(47) + S(48) + S(49) + S(50) + S(51) + Denc(0);
C(41) = Denc(7) + Denc(5) + Denc(2) + Denc(1) + S(33) + S(44) + S(46) + S(49) + S(50) + S(51) + Denc(0);
C(42) = Denc(6) + Denc(4) + Denc(1) + S(34) + S(45) + S(47) + S(50) + S(51) + Denc(0);
C(43) = Denc(5) + Denc(3) + S(35) + S(46) + S(48) + S(51) + Denc(0);
C(44) = Denc(7) + Denc(5) + Denc(4) + Denc(3) + Denc(2) + S(36) + S(44) + S(46) + S(47) + S(48) + S(49);
C(45) = Denc(6) + Denc(4) + Denc(3) + Denc(2) + Denc(1) + S(37) + S(45) + S(47) + S(48) + S(49) + S(50);
C(46) = Denc(7) + Denc(2) + Denc(1) + S(38) + S(44) + S(49) + S(50) + S(51) + Denc(0);
C(47) = Denc(6) + Denc(1) + S(39) + S(45) + S(50) + S(51) + Denc(0);
C(48) = Denc(5) + S(40) + S(46) + S(51) + Denc(0);
C(49) = Denc(4) + S(41) + S(47);
C(50) = Denc(7) + Denc(5) + S(42) + S(44) + S(46);
C(51) = Denc(6) + Denc(4) + S(43) + S(45) + S(47);

APPENDIX B

LOGIC $S_1$ THROUGH LOGIC $S_7$

```
// LOGIC- 1 multiplication by $\alpha$
  S1( 0) = S1(12) + Din;
  S1( 1) = S1( 0) + S1(12);
  S1( 2) = S1( 1);
  S1( 3) = S1( 2) + S1(12);
  S1( 4) = S1( 3) + S1(12);
  S1( 5) = S1( 4);
  S1( 6) = S1( 5);
  S1( 7) = S1( 6);
  S1( 8) = S1( 7);
  S1( 9) = S1( 8);
  S1(10) = S1( 9);
  S1(11) = S1(10);
  S1(12) = S1(11);
// LOGIC- 2 multiplication by $\alpha^2$
  S2( 0) = S2(11) + Din;
  S2( 1) = S2(11) + S2((12);
  S2( 2) = S2( 0) + S2((12);
  S2( 3) = S2( 1) + S2((11);
  S2( 4) = S2( 2) + S2((11) + S2((12);
  S2( 5) = S2( 3) + S2((12);
  S2( 6) = S2( 4);
  S2( 7) = S2( 5);
  S2( 8) = S2( 6);
  S2( 9) = S2( 7);
  S2(10) = S2( 8);
  S2(11) = S2( 9);
  S2(12) = S2(10);
// LOGIC- 3 multiplication by $\alpha^3$
  S3( 0) = S3(10) + Din;
  S3( 1) = S3(10) + S3((11);
  S3( 2) = S3(11) + S3((12);
  S3( 3) = S3( 0) + S3((10) + S3((12);
  S3( 4) = S3( 1) + S3((10) + S3((11);
  S3( 5) = S3( 2) + S3((11) + S3((12);
  S3( 6) = S3( 3) + S3((12);
  S3( 7) = S3( 4);
  S3( 8) = S3( 5);
  S3( 9) = S3( 6);
  S3(10) = S3( 7);
  S3(11) = S3( 8);
  S3(12) = S3( 9);
// LOGIC- 4 multiplication by $\alpha^4$
  S4( 0) = S4( 9) + Din;
  S4( 1) = S4( 9) + S4(10),
  S4( 2) = S4(10) + S4((11);
  S4( 3) = S4( 9) + S4((11) + S4((12);
  S4( 4) = S4( 0) + S4(( 9) + S4((10) + S4 ((12);
  S4( 5) = S4( 1) + S4((10) + S4((11);
  S4( 6) = S4( 2) + S4((11) + S4((12);
  S4( 7) = S4( 3) + S4((12);
  S4( 8) = S4( 4);
  S4( 9) = S4( 5);
  S4(10) = S4( 6);
  S4(11) = S4( 7);
  S4(12) = S4( 8);
// LOGIC- 5 multiplication by $\alpha^5$
  S5( 0) = S5( 8) + Din;
  S5( 1) = S5( 8) + S5(( 9);
  S5( 2) = S5( 9) + S5((10);
  S5( 3) = S5( 8) + S5((10) + S5((11);
  S5( 4) = S5( 8) + S5(( 9) + S5((11) + S5 ((12);
  S5( 5) = S5( 0) + S5(( 9) + S5((10) + S5 ((12);
  S5( 6) = S5( 1) + S5((10) + S5((11);
  S5( 7) = S5( 2) + S5((11) + S5((12);
  S5( 8) = S5( 3) + S5((12);
  S5( 9) = S5( 4);
  S5(10) = S5( 5);
  S5(11) = S5( 6);
  S5(12) = S5( 7);
// LOGIC- 7 multiplication by $\alpha^7$
  S7( 0) = S7( 6) + Din;
  S7( 1) = S7( 6) + S7(( 7);
  S7( 2) = S7( 7) + S7(( 8);
  S7( 3) = S7( 6) + S7(( 8) + S7(9);
  S7( 4) = S7( 6) + S7(( 7) + S7(( 9) + S7 ((10);
  S7( 5) = S7( 7) + S7(( 8) + S7((10) + S7 ((11);
```

APPENDIX B-continued

LOGIC $S_1$ THROUGH LOGIC $S_7$ $S7(6) = S7(8) + S7((9)) + S7((11)) + S7((12));$
$S7(7) = S7(0) + S7((9)) + S7((10)) + S7((12));$
$S7(8) = S7(1) + S7((10)) + S7((11));$
$S7(9) = S7(2) + S7((11)) + S7((12));$
$S7(10) = S7(3) + S7((12));$
$S7(11) = S7(4);$
$S7(12) = S7(5);$

What is claimed is:

1. A method for correcting errors in data, comprising:

reading said data from a computer storage;

utilizing a binary coded hexadecimal (BCH) decoder computing a binary coded hexadecimal (BCH) decoding syndrome to determine if a number of errors is zero for a block of said data which includes at least a previously computed BCH encoding syndrome and a previously computed Hamming encoding syndrome;

in the case that the determined number of errors is not zero, using said BCH computed decoding syndrome or a function thereof in order to detect whether there is a single error or multiple errors;

in the case that the detected number of errors equals to one, using a Hamming decoder for computing a Hamming decoding syndrome or a function thereof to locate said detected error;

in the case that the detected number of errors is more than one, using said computed BCH decoding syndrome or a function thereof to locate said more than one error; and correcting said located at least one error.

2. The method according to claim 1, wherein said more than one error being any from the group that consists of two errors, three errors and four errors.

3. A system for reading data from a computer storage and correcting errors in the data, comprising:

a binary coded hexadecimal (BCH) decoder configured for determining a binary coded hexadecimal (BCH) decoding syndrome in order to determine if a number of errors is zero for a block of said data; said block of said data includes at least a previously computed BCH encoding syndrome and a previously computed Hamming encoding syndrome;

in the case that the determined number of errors is not zero, using said BCH computed decoding syndrome or a function thereof in order to detect whether there is a single error or multiple errors;

a Hamming decoder configured, in the case that the detected number of errors equals to one, to compute a Hamming decoding syndrome or a function thereof to locate said detected error;

in the case that the detected number of errors is more than one, using said computed BCH decoding syndrome or a function thereof to locate said more than one error.

4. The system according to claim 3, wherein said more than one error being any from the group that consists of two errors, three errors and four errors.

* * * * *